(12) United States Patent
Choi et al.

(10) Patent No.: US 11,574,692 B2
(45) Date of Patent: Feb. 7, 2023

(54) NONVOLATILE MEMORY DEVICE AND OPERATION METHOD OF DETECTING DEFECTIVE MEMORY CELLS

(71) Applicant: SAMSUNG ELECTRONICS CO., LTD., Suwon-si (KR)

(72) Inventors: Kwangho Choi, Suwon-si (KR); Jin-Young Kim, Seoul (KR); Se Hwan Park, Yongin-si (KR); Il Han Park, Suwon-si (KR); Ji-Sang Lee, Iksan-si (KR); Joonsuc Jang, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/359,688

(22) Filed: Jun. 28, 2021

(65) Prior Publication Data

US 2022/0101930 A1    Mar. 31, 2022

(30) Foreign Application Priority Data

Sep. 28, 2020   (KR) .......................... 10-2020-0126112

(51) Int. Cl.
*G11C 16/34* (2006.01)
*G11C 11/56* (2006.01)
(Continued)

(52) U.S. Cl.
CPC ........ *G11C 16/349* (2013.01); *G11C 11/5628* (2013.01); *G11C 11/5635* (2013.01);
(Continued)

(58) Field of Classification Search
CPC .............. G11C 16/349; G11C 11/5628; G11C 11/5635; G11C 11/5671; G11C 16/0483;
(Continued)

(56) References Cited

U.S. PATENT DOCUMENTS 9,019,773 B2    4/2015  Park et al.
9,318,224 B2    4/2016  Kwak
(Continued)

FOREIGN PATENT DOCUMENTS

CN          110853694 A     2/2020
KR       1020150116351 A    10/2015

*Primary Examiner* — Vanthu T Nguyen
(74) *Attorney, Agent, or Firm* — Volentine, Whitt & Francos, PLLC

(57) ABSTRACT

A nonvolatile memory device includes a memory cell array having cell strings that each includes memory cells stacked on a substrate in a direction perpendicular to the substrate. A row decoder is connected with the memory cells through word lines. The row decoder applies a setting voltage to at least one word line of the word lines and floats the at least one word line during a floating time. A page buffer circuit is connected with the cell strings through bit lines. The page buffer senses voltage changes of the bit lines after the at least one word line is floated during the floating time and outputs a page buffer signal as a sensing result. A counter counts a number of off-cells in response to the page buffer signal. A detecting circuit outputs a detection signal associated with a defect cell based on the number of off-cells.

25 Claims, 25 Drawing Sheets

(51) Int. Cl.
*G11C 16/04* (2006.01)
*G11C 16/08* (2006.01)
*G11C 16/10* (2006.01)
*G11C 16/16* (2006.01)
*G11C 16/24* (2006.01)
*H01L 25/065* (2006.01)
*H01L 25/18* (2006.01)
*H01L 23/00* (2006.01)

(52) U.S. Cl.
CPC ...... *G11C 11/5671* (2013.01); *G11C 16/0483* (2013.01); *G11C 16/08* (2013.01); *G11C 16/10* (2013.01); *G11C 16/16* (2013.01); *G11C 16/24* (2013.01); *G11C 16/3459* (2013.01); *H01L 24/08* (2013.01); *H01L 25/0657* (2013.01); *H01L 25/18* (2013.01); *H01L 2224/08145* (2013.01); *H01L 2924/1431* (2013.01); *H01L 2924/14511* (2013.01)

(58) Field of Classification Search
CPC ......... G11C 16/08; G11C 16/10; G11C 16/16; G11C 16/24; G11C 16/3459
See application file for complete search history.

(56) References Cited

U.S. PATENT DOCUMENTS

| | | | |
|---|---|---|---|
| 9,330,789 B2 * | 5/2016 | Tanzawa | G11C 16/14 |
| 9,548,129 B2 | 1/2017 | Paudel et al. | |
| 9,646,696 B2 | 5/2017 | Yang | |
| 9,691,486 B2 * | 6/2017 | Kim | G11C 16/12 |
| 9,842,659 B2 * | 12/2017 | Nam | G11C 29/025 |
| 2019/0115081 A1 | 4/2019 | Lee | |

\* cited by examiner

NONVOLATILE MEMORY DEVICE AND OPERATION METHOD OF DETECTING DEFECTIVE MEMORY CELLS

CROSS-REFERENCE TO RELATED APPLICATIONS

This application claims priority under 35 U.S.C. § 119 to Korean Patent Application No. 10-2020-0126112 filed on Sep. 28, 2020, in the Korean Intellectual Property Office, the disclosure of which is incorporated by reference herein in its entirety.

BACKGROUND

Embodiments of the present disclosure described herein relate to a semiconductor memory, and more particularly, relate to a nonvolatile memory device and an operation method thereof.

A semiconductor memory is classified as a volatile memory, in which stored data disappear when power is turned off, such as a static random access memory (SRAM) or a dynamic random access memory (DRAM), or a nonvolatile memory, in which stored data are retained even when power is turned off, such as a flash memory, a phase-change RAM (PRAM), a magnetic RAM (MRAM), a resistive RAM (RRAM), or a ferroelectric RAM (FRAM).

The flash memory device is configured to store data by changing threshold voltages of memory cells. In the case where a leakage current occurs due to a channel hole breakout, threshold voltages of memory cells are not changed to a target threshold voltage or greater, thereby causing an increase in the number of erroneous data bits of data bits read from the memory cells.

SUMMARY

Embodiments of the present disclosure provide a nonvolatile memory device with improved reliability and improved performance by detecting, in advance, a defect cell where a channel hole breakout occurs and an operation method thereof.

According to an embodiment, a nonvolatile memory device includes a memory cell array that includes a plurality of cell strings. Each of the cell strings includes memory cells stacked on a substrate in a direction perpendicular to the substrate. A row decoder is connected with the memory cells through a plurality of word lines and applies a setting voltage to at least one word line of the plurality of word lines and floats the at least one word line during a floating time. A page buffer circuit is connected with the plurality of cell strings through a plurality of bit lines, senses voltage changes of the plurality of bit lines after the at least one word line is floated during the floating time, and outputs a page buffer signal as a sensing result. A counter counts a number of off-cells in response to the page buffer signal. A detecting circuit outputs a detection signal associated with a defect cell based on the number of off-cells.

According to an embodiment, a storage device includes a nonvolatile memory device that includes a plurality of cell strings. Each of the plurality of cell strings includes memory cells stacked on a substrate in a direction perpendicular to the substrate. A memory controller transmits a command to the nonvolatile memory device. The nonvolatile memory device performs a defect cell detection operation in response to the command. The defect cell detection operation includes: (a) applying a setting voltage to at least one word line of a plurality of word lines connected with the memory cells, (b) floating the at least one word line during a floating time, (c) sensing voltage changes of bit lines connected with the plurality of cell strings and outputting a page buffer signal as a sensing result, after the at least one word line is floated during the floating time, (d) counting a number of off-cells in response to the page buffer signal, and € outputting a detection signal associated with a defect cell based on the number of off-cells.

According to an embodiment, a nonvolatile memory device includes a plurality of cell strings, each of which includes memory cells stacked on a substrate in a direction perpendicular to the substrate. A method of operating the nonvolatile memory device includes: (a) applying a setting voltage to at least one word line of a plurality of word lines connected with the memory cells, (b) floating the at least one word line during a floating time, (c) sensing voltage changes of a plurality of bit lines connected with the plurality of cell strings and outputting a page buffer signal as a sensing result, after the at least one word line is floated during the floating time, (d) counting a number of off-cells in response to the page buffer signal, and (e) outputting a detection signal associated with a defect cell based on the number of off-cells.

BRIEF DESCRIPTION OF THE FIGURES

The above and other objects and features of the present disclosure will become apparent by describing in detail some embodiments thereof with reference to the accompanying drawings.

DETAILED DESCRIPTION

Below, embodiments of the present disclosure may be described in detail and clearly to such an extent that an ordinary one in the art easily implements the present disclosure.

Figure 1:
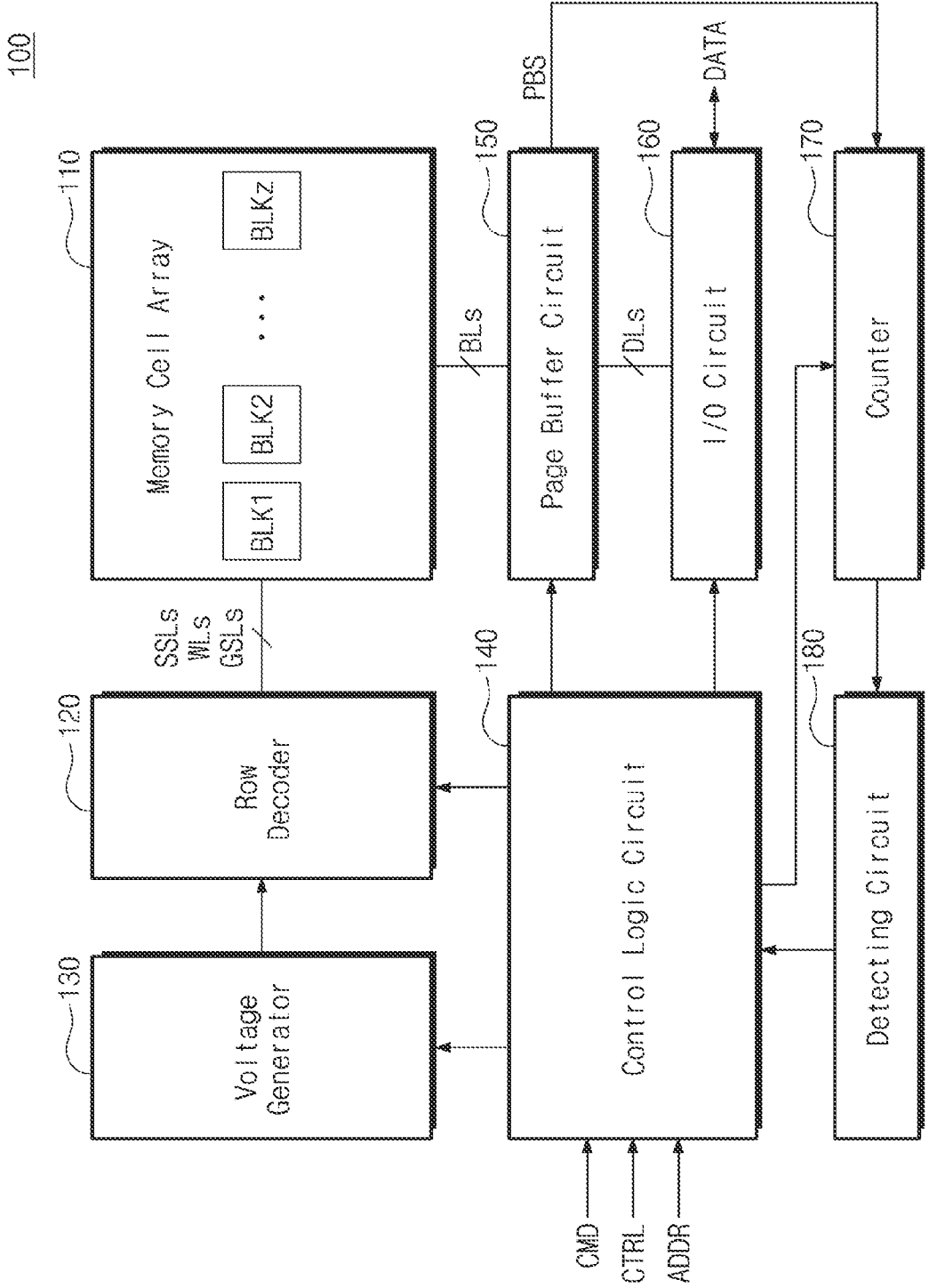
FIG. 1 is a block diagram illustrating a nonvolatile memory device according to an embodiment of the present disclosure.

FIG. 1 is a block diagram illustrating a nonvolatile memory device according to an embodiment of the present disclosure.

Referring to FIG. 1, a nonvolatile memory device 100 may include a memory cell array 110, a row decoder 120, a voltage generator 130, a control logic circuit 140, a page buffer circuit 150, an input/output circuit 160, a counter 170, and a detecting circuit 180.

The memory cell array 110 may include a plurality of memory cells that are respectively disposed at intersections of a plurality of word lines WLs and a plurality of bit lines BLs. The plurality of memory cells may form a plurality of memory blocks BLK1, BLK2, and BLKz. The plurality of memory cells may be connected with the plurality of word lines WLs, and the memory cell array 110 may be connected with the row decoder 120 through the plurality of word lines WLs.

The row decoder 120 may be connected with the memory cell array 110 through a plurality of string selection lines SSLs, the plurality of word lines WLs, and a plurality of ground selection lines GSLs. The row decoder 120 may operate under control of the control logic circuit 140. The row decoder 120 may decode an address ADDR under control of the control logic circuit 140. An embodiment is illustrated in FIG. 1 as the control logic circuit 140 receives the address ADDR, but the present disclosure is not limited thereto. For example, the row decoder 120 is capable of receiving the address ADDR from a memory controller (not illustrated).

The row decoder 120 may control the plurality of string selection lines SSLs, the plurality of word lines WLs, and the plurality of ground selection lines GSLs based on a result of decoding the address ADDR. For example, the row decoder 120 may select one or more of the plurality of word lines WLs based on a control signal of the control logic circuit 140. Below, in the specification, a word line selected by the row decoder 120 may be referred to as a "selection word line".

The voltage generator 130 may generate voltages for performing an erase operation, a program operation, and a read operation of the nonvolatile memory device 100. For example, the voltage generator 130 may generate a power supply voltage, an erase voltage, a program voltage, a read voltage, a pass voltage, an erase verification voltage, a program verification voltage, or the like. Also, the voltage generator 130 may further generate a string selection line voltage and a ground selection line voltage.

The voltage generator 130 may apply a setting voltage to a selection word line through the row decoder 120, based on a control signal of the control logic circuit 140. The voltage generator 130 may apply the setting voltage that is variable depending on the erase operation or the program operation. The voltage generator 130 may apply the setting voltage that is variable depending on the order of performing the erase operation or the program operation, which will be more fully described later.

The control logic circuit 140 may receive at least one of a command CMD, a control signal CTRL, and an address from the memory controller. In response to a signal received from the memory controller, the control logic circuit 140 may control at least one of the row decoder 120, the voltage generator 130, the page buffer circuit 150, the input/output circuit 160, and the counter 170.

In response to an erase command or a program command, the control logic circuit 140 may control the erase operation or the program operation of the nonvolatile memory device 100. The control logic circuit 140 may control the row decoder 120 to select a word line or word lines. The control logic circuit 140 may control the voltage generator 130 such that the setting voltage is applied to the selection word line or the selection word lines. The control logic circuit 140 may generate a floating signal of blocking a current flowing to the selection word line or the selection word lines. In other words, the control logic circuit 140 may control the row decoder 120 or the voltage generator 130 such that the selection word line or the selection word lines are floated.

The page buffer circuit 150 may be connected with the memory cell array 110 through the plurality of bit lines BLs. The page buffer circuit 150 may store data in the memory cell array 110 by controlling the bit lines BL. The page buffer circuit 150 may read data stored in the memory cell array 110 by sensing voltages of the bit lines BL.

The page buffer circuit 150 may temporarily store data read from the memory cell array 110 or data to be stored in the memory cell array 110. For example, in an erase or program verification read operation associated with memory cells of a selection word line, the page buffer circuit 150 may sense voltages of the bit lines BLs and may store a result of the sensing. The page buffer circuit 150 may output a page buffer signal PBS corresponding to the sensing result stored therein.

The input/output circuit 160 may be connected with the page buffer circuit 150 through a plurality of data lines DLs. The input/output circuit 160 may output data read by the page buffer circuit 150 to the memory controller through an output channel and may transfer data received from the memory controller through an input channel to the page buffer circuit 150.

The counter 170 may receive the page buffer signal PBS from the page buffer circuit 150 and may count the number of off-cells based on the page buffer signal PBS. In this case, the off-cells may include memory cells, of which threshold voltages are greater than a setting voltage, from among memory cells connected with a selection word line after the selection word line is floated. According to an embodiment, the off-cells may correspond to memory cells that are not normally erased. According to an embodiment, the off-cells may correspond to memory cells that are not normally programmed. The counter 170 may provide a counting value to the detecting circuit 180.

The detecting circuit 180 may compare the number of off-cells, which the counting result indicates, with a reference value to output a defect cell detection signal. A defect cell may include a memory cell where there occurs a channel hole breakout in which a gate of the memory cell and a channel are short-circuited. A word line connected with the defect cell may be electrically connected with the channel, thereby causing a leakage current. Below, in the specification, a defect cell may mean a memory cell where a channel hole breakout occurs.

When the number of off-cells among the memory cells connected with the selection word line is more than the reference value, the detecting circuit 180 may generate a signal indicating that a defect cell is detected. When the number of off-cells among the memory cells connected with the selection word line is equal to or less than the reference value, the detecting circuit 180 may generate a signal indicating that a defect cell is not detected. The detecting circuit 180 may provide the defect cell detection signal to the control logic circuit 140.

The nonvolatile memory device 100 may transfer the defect cell detection signal to the memory controller. The memory controller may process a memory block including the defect cell as a bad block based on the defect cell detection signal. As such, the reliability of data of the nonvolatile memory device 100 may be secured, and the performance of the nonvolatile memory device 100 may be improved.

The nonvolatile memory device 100 may store data by changing threshold voltages of memory cells through the erase operation or the program operation. In the case where a leakage current occurs due to a defect cell, there is a limitation in changing threshold voltages of memory cells. For this reason, there is a need to detect a defect cell for the purpose of securing the reliability of data.

The nonvolatile memory device 100 according to an embodiment of the present disclosure may detect a defect cell by applying a setting voltage to one or more selection word lines of a plurality of word lines and floating the selection word lines with the setting voltage applied thereto. In the case of a word line connected with a defect cell where a channel hole breakout occurs, even though the setting voltage is applied to the word line, the setting voltage of the word line may decrease after the word line is floated. As such, memory cells connected with the word line, that is, the selection word line may be turned off. The nonvolatile memory device 100 may count the number of off-cells, may compare the number of off-cells with the reference value, and may determine whether a defect cell occurs, based on a result of the comparison.

Figure 2:
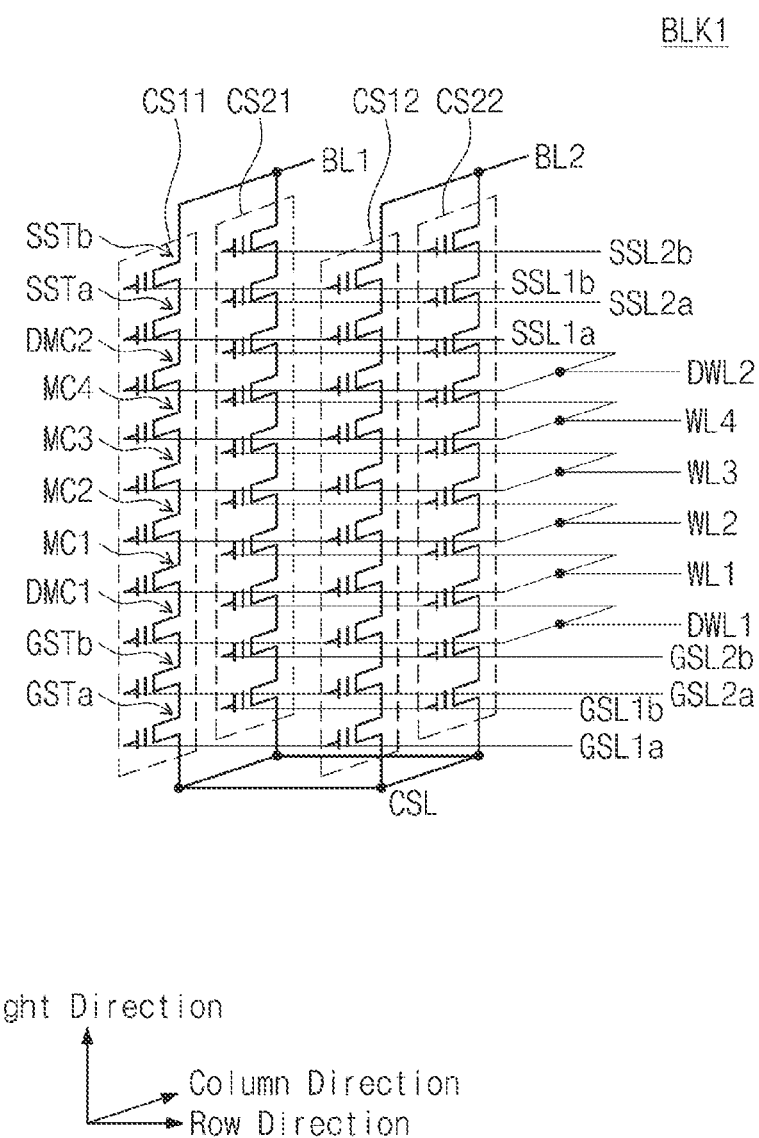
FIG. 2 is a diagram illustrating a memory block of a plurality of memory blocks included in a memory cell array in FIG. 1.

FIG. 2 is a diagram illustrating a memory block of a plurality of memory blocks included in a memory cell array in FIG. 1. For brevity of drawing and for convenience of description, one memory block BLK1 is illustrated by way of example, but the present disclosure is not limited thereto. For example, the remaining memory blocks may also have a structure similar to that of the memory block BLK1 of FIG. 2.

Referring to FIG. 2, the first memory block BLK1 may include a plurality of cell strings CS11, CS12, CS21, and CS22. The plurality of cell strings CS11, CS12, CS21, and CS22 may be arranged in a row direction and a column direction. For brevity of drawing, four cell strings CS11, CS12, CS21, and CS22 are illustrated in FIG. 2, but the present disclosure is not limited thereto. For example, the number of cell strings may increase or decrease in the row direction or the column direction.

Cell strings placed at the same column from among the plurality of cell strings CS11, CS12, CS21, and CS22 may be connected with the same bit line. For example, the cell strings CS11 and CS21 may be connected with a first bit line BL1, and the cell strings CS12 and CS22 may be connected with a second bit line BL2. Each of the plurality of cell strings CS11, CS12, CS21, and CS22 may include a plurality of cell transistors. In each cell string, the plurality of cell transistors may be implemented with a charge trap flash (CTF) memory cell. In each cell string, the plurality of cell transistors may be stacked in a height direction that is a direction perpendicular to a plane defined by the row direction and the column direction (e.g., to a semiconductor substrate (not illustrated)).

In each cell string, the plurality of cell transistors may be connected in series between a relevant bit line (e.g., BL1 or BL2) and a common source line CSL. For example, in each cell string, the plurality of cell transistors may include string selection transistors SSTa and SSTb, dummy memory cells DMC1 and DMC2, memory cells MC1 to MC4, and ground selection transistors GSTa and GSTb. The serially-connected string selection transistors SSTa and SSTb may be provided between the serially-connected memory cells MC1 to MC4 and a relevant bit line (e.g., BL1 or BL2). The serially-connected ground selection transistors GSTa and GSTb may be provided between the serially-connected memory cells MC1 to MC4 and the common source line CSL. In an embodiment, the second dummy memory cell DMC2 may be provided between the serially-connected string selection transistors SSTa and SSTb and the serially-connected memory cells MC1 to MC4, and the first dummy memory cell DMC1 may be provided between the serially-connected memory cells MC1 to MC4 and the serially-connected ground selection transistors GSTa and GSTb.

In the plurality of cell strings CS11, CS12, CS21, and CS22, memory cells placed at the same height from among the memory cells MC1 to MC4 may share the same word line. For example, the first memory cells MC1 of the plurality of cell strings CS11, CS12, CS21, and CS22 may be placed at the same height from the substrate (not illustrated) and may share a first word line WL1. The second memory cells MC2 of the plurality of cell strings CS11, CS12, CS21, and CS22 may be placed at the same height from the substrate (not illustrated) and may share a second word line WL2. Likewise, the third memory cells MC3 of the plurality of cell strings CS11, CS12, CS21, and CS22 may be placed at the same height from the substrate (not illustrated) and may share a third word line WL3, and the fourth memory cells MC4 of the plurality of cell strings CS11, CS12, CS21, and CS22 may be placed at the same height from the substrate (not illustrated) and may share a fourth word line WL4.

Dummy memory cells placed at the same height from among the dummy memory cells DMC1 and DMC2 of the plurality of cell strings CS11, CS12, CS21, and CS22 may share the same dummy word line. For example, the first dummy memory cells DMC1 of the plurality of cell strings CS11, CS12, CS21, and CS22 may share a first dummy word line DWL1, and the second dummy memory cells DMC2 of the plurality of cell strings CS11, CS12, CS21, and CS22 may share a second dummy word line DWL2.

String selection transistor placed at the same height and the same row from among the string selection transistor SSTa and SSTb of the plurality of cell strings CS11, CS12, CS21, and CS22 may be connected with the same string selection line. For example, the string selection transistors SSTb of the cell strings CS11 and CS12 may be connected with a string selection line SSL1*b*, and the string selection transistors SSTa of the cell strings CS11 and CS12 may be connected with a string selection line SSL1*a*. The string selection transistors SSTb of the cell strings CS21 and CS22 may be connected with a string selection line SSL2*b*, and the string selection transistors SSTa of the cell strings CS21 and CS22 may be connected with a string selection line SSL2*a*.

Ground selection transistors placed at the same height and the same row from among the ground selection transistors GSTb and GSTa of the plurality of cell strings CS11, CS12, CS21, and CS22 may be connected with the same ground selection line. For example, the ground selection transistors GSTb of the cell strings CS11 and CS12 may be connected with a ground selection line GSL1*b*, and the ground selection transistors GSTa of the cell strings CS11 and CS12 may be connected with a ground selection line GSL1*a*. The ground selection transistors GSTb of the cell strings CS21 and CS22 may be connected with a ground selection line GSL2*b*, and the ground selection transistors GSTa of the cell strings CS21 and CS22 may be connected with a ground selection line GSL2*a*.

The first memory block BLK1 illustrated in FIG. 2 is an example. The number of cell strings may increase or decrease, and the number of rows of cell strings and the number of columns of cell strings may increase or decrease depending on the number of cell strings. Also, in the first memory block BLK1, the number of cell transistors may increase or decrease, and the height of the first memory block BLK1 may increase or decrease depending on the number of cell transistors. In addition, the number of lines connected with cell transistors may increase or decrease depending on the number of cell transistors.

Figure 3:
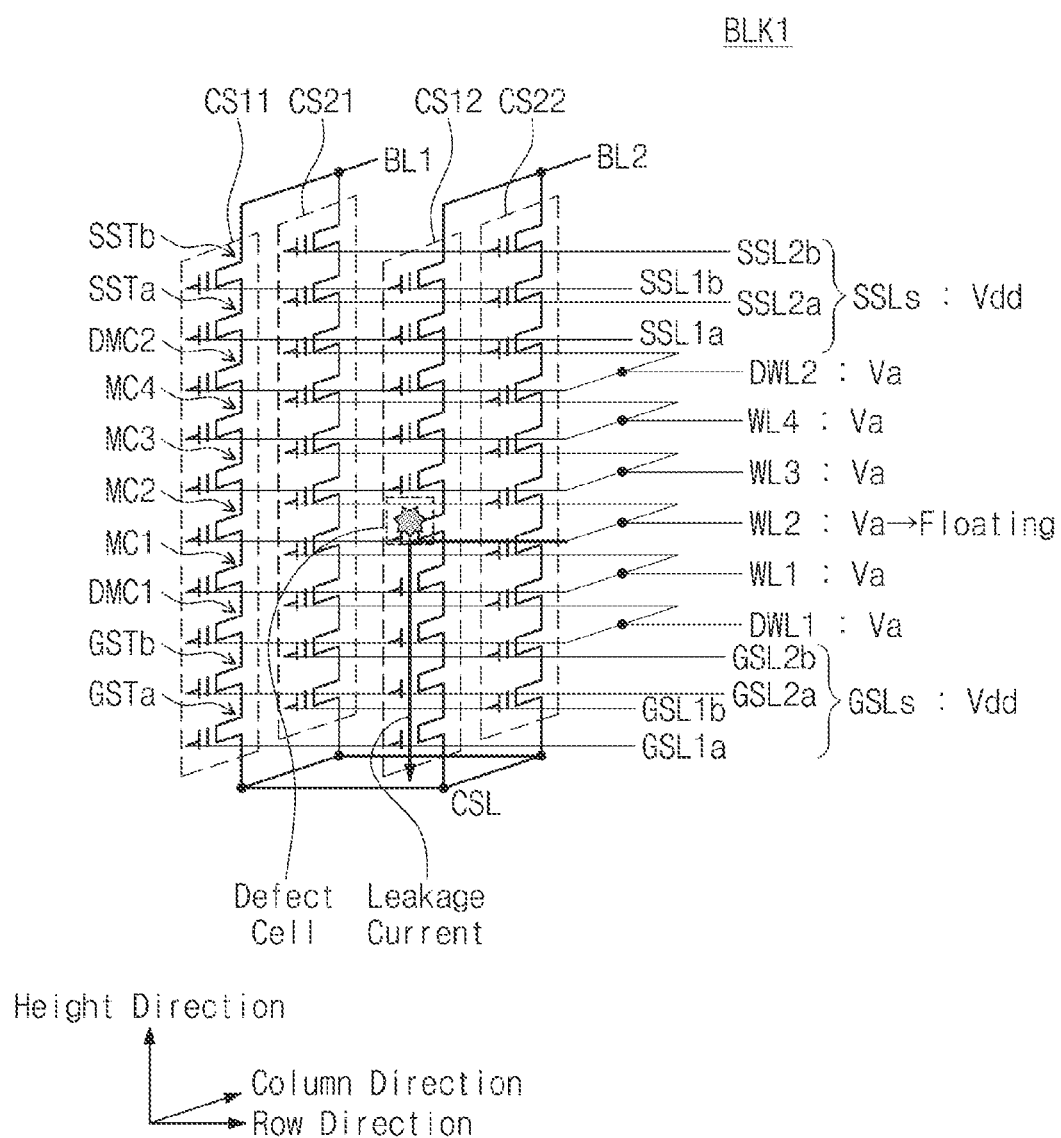
FIG. 3 is a diagram for describing a defect cell detection method of a nonvolatile memory device of FIG. 1.

FIG. 3 is a diagram for describing a defect cell detection method of a nonvolatile memory device of FIG. 1.

Referring to FIGS. 2 and 3, the first memory block BLK1 may include the plurality of cell strings CS11 to CS22. The structure of the first memory block BLK1 is described above, and thus, additional description will be omitted to avoid redundancy. Below, to describe the present disclosure easily, it is assumed that a memory cell connected with the second word line WL2 from among memory cells of the cell string CS12 is a defect cell DC. The channel hole breakout may occur at a portion, which is adjacent to the defect cell DC, of a channel of the cell string CS12. In this case, the channel of the cell string CS12 and the second word line WL2 may be electrically short-circuited.

The nonvolatile memory device 100 may apply a power supply voltage Vdd to the plurality of string selection lines SSL1*a*, SSL1*b*, SSL2*a*, and SSL2*b* and the plurality of ground selection lines GSL1*a*, GSL1*b*, GSL2*a*, and GSL2*b*. The nonvolatile memory device 100 may apply a setting voltage Va to the plurality of word lines WL1 to WL4 and the plurality of dummy word lines DWL1 and DWL2 and may float at least one (e.g., the second word line WL2) of the plurality of word lines WL1 to WL4. For convenience of description, the description will be given in which the second word line WL2 is floated, but the present disclosure is not limited thereto. For example, the number of word lines to be floated may be changed.

Because the second word line WL2 is connected with the defect cell DC, the second word line WL2 may be in a state of being electrically connected with the channel of the cell string CS12. In this case, after the second word line WL2 is floated, a voltage of the second word line WL2 may decrease to a voltage of the common source line CSL due to a leakage current LC. In an embodiment, the voltage of the common source line CSL may be a ground voltage or a negative voltage. Below, for convenience of description, it is assumed that the voltage of the common source line CSL is the ground voltage.

In the case where the voltage of the second word line WL2 decreases to the ground voltage, memory cells connected with the second word line WL2 may be turned off. The counter 170 may count the number of turned-off memory cells (i.e., off-cells), and the detecting circuit 180 may detect the defect cell DC (or may detect that the defect cell DC occurs at the second word line WL2), based on a result of the counting.

That is, the nonvolatile memory device 100 may detect a memory block including the defect cell DC by applying the setting voltage Va to a plurality of word lines and floating the plurality of word lines, and may process the detected memory block as a bad block.

Figure 4:
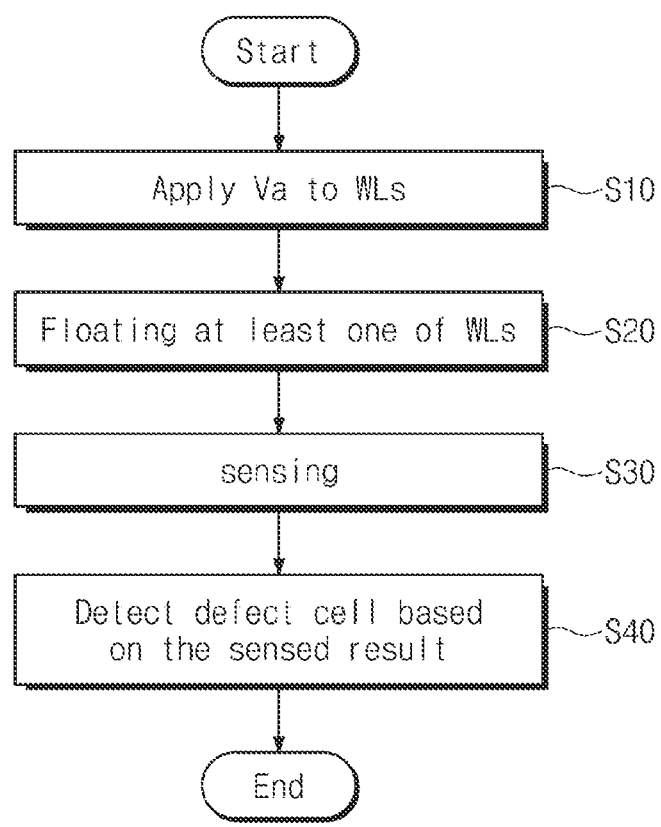
FIG. 4 is a flowchart illustrating an operation method of a nonvolatile memory device according to an embodiment of the present disclosure.

FIG. 4 is a flowchart illustrating an operation method of a nonvolatile memory device according to an embodiment of the present disclosure.

Referring to FIGS. 3 and 4, in operation S10, the nonvolatile memory device 100 may apply the setting voltage Va to the plurality of word lines WLs. The setting voltage Va may be a voltage sufficient to turn on memory cells of a memory block. That is, when the setting voltage Va is applied to the plurality of word lines WLs, all the memory cells of the memory block may be turned on.

In operation S20, the nonvolatile memory device 100 may float at least one word line. The at least one word line may be floated by blocking a voltage applied to the at least one word line or blocking a current flowing to the at least one word line. The nonvolatile memory device 100 may float the at least one word line by opening a switching element connected with the at least one word line.

In operation S30, the nonvolatile memory device 100 may perform a sensing operation. In an embodiment, the sensing operation may include an operation of sensing voltages of the bit lines BLs and counting the number of off-cells based on a result of the sensing.

As a word line connected with the defect cell DC is floated, a voltage of the word line may decrease. For example, as illustrated in FIG. 3, in the case where the second word line WL2 connected with the defect cell DC is floated, a voltage of the second word line WL2 may decrease to a voltage of the common source line CSL. That is, the voltage of the second word line WL2 may correspond to the setting voltage Va immediately after the setting voltage Va is applied thereto. However, in the case where a given time passes from a time when the second word line WL2 is floated, the voltage of the second word line WL2 may decrease to 0 V. After the given time passes, the nonvolatile memory device 100 may count off-cells by sensing the voltages of the bit lines BLs.

In operation S40, the nonvolatile memory device 100 may detect a defect cell based on a result sensed in operation S30. When the number of off-cells is more than the reference value, the nonvolatile memory device 100 may determine that a defect cell is detected; when the number of off-cells is equal to or less than the reference value, the nonvolatile memory device 100 may determine that a defect cell is not detected.

Figure 5:
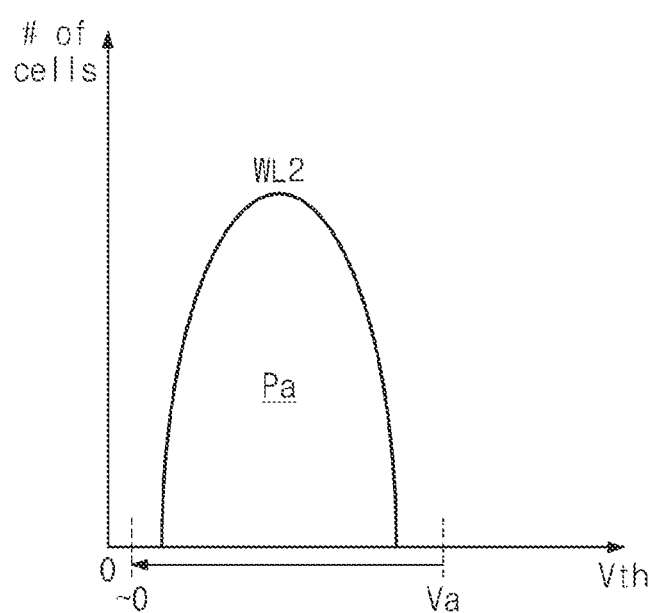
FIG. 5 is a diagram illustrating a distribution change according to floating of a second word line of FIG. 3.

FIG. 5 is a diagram illustrating a distribution change according to floating of a second word line of FIG. 3.

In FIG. 5, a horizontal axis represents a threshold voltage Vth of a memory cell, and a vertical axis represents the number of memory cells. For convenience of description, it is assumed that memory cells connected with the second word line WL2 form a specific threshold voltage distribution Pa. However, the present disclosure is not limited thereto. For example, a threshold voltage distribution of the memory cells connected with the second word line WL2 may be variously changed depending on data stored therein.

Referring to FIGS. 3 and 5, the setting voltage Va may be applied to the second word line WL2. When the second word line WL2 is floated, a voltage of the second word line WL2 may decrease from the setting voltage Va to 0 V.

The setting voltage Va may be a voltage sufficient to turn on memory cells of a memory block. That is, the setting voltage Va may be determined to be higher than threshold voltages of the memory cells connected with the second word line WL2. Therefore, the number of off-cells immediately after the setting voltage Va is applied to the second word line WL2 may be "0". However, because the second word line WL2 is connected with the defect cell DC, a voltage drop may occur due to a leakage current when the second word line WL2 is floated. Accordingly, a word line voltage of the second word line WL2 may decrease over time.

According to an embodiment, when the second word line WL2 is floated, the voltage of the second word line WL2 may be 0 V, and thus, all the memory cells connected with the second word line WL2 may be turned off. Under this condition, in the case of counting the number of off-cells of the second word line WL2, the number of counted off-cells may be one or more.

In other words, in the case where the setting voltage Va higher than threshold voltages of memory cells connected with a selection word line is applied to the selection word line and the selection word line is then floated, the number of off-cells may be classified as "0" and "1 or more" depending on whether a defect cell exists. When the number of off-cells is "0", the nonvolatile memory device 100 may determine that the defect cell DC does not exist; when the number of off-cells is "1 or more", the nonvolatile memory device 100 may determine that the defect cell DC exists.

Figure 6:
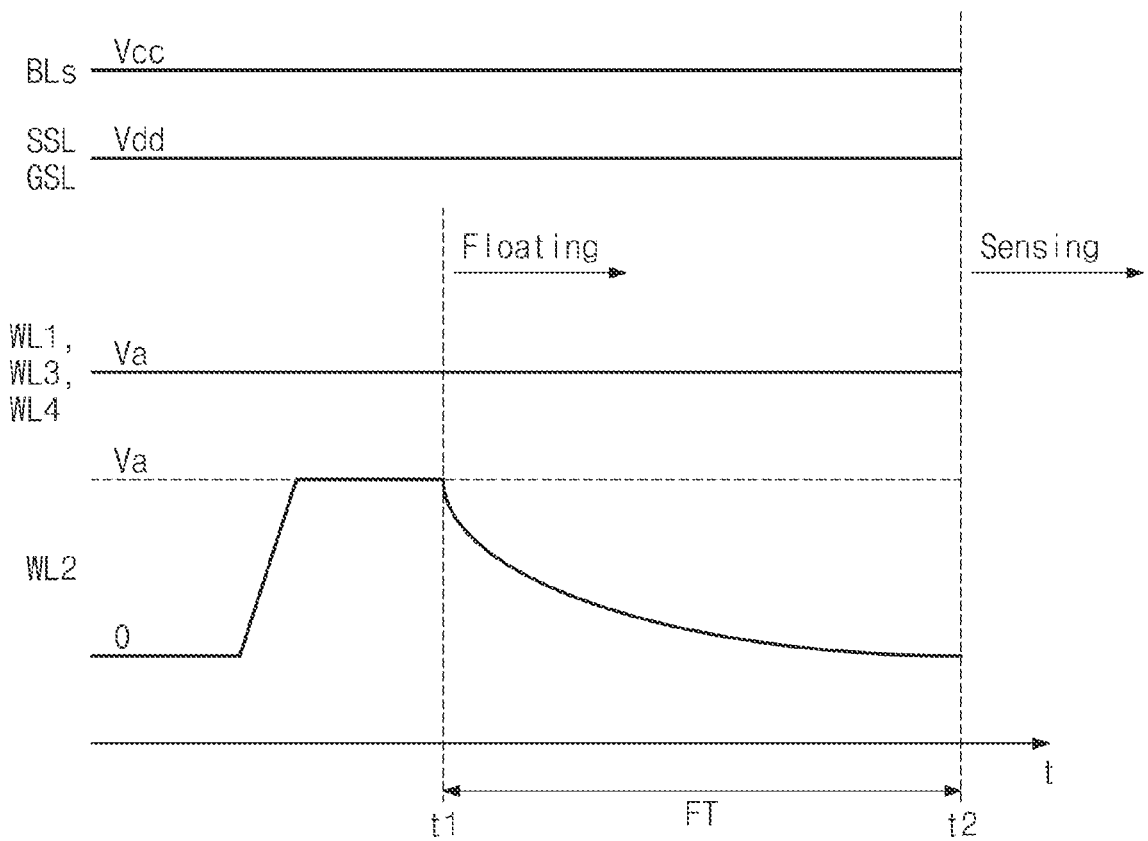
FIG. 6 is a timing diagram illustrating a defect cell detection operation of a nonvolatile memory device of FIG. 1.

FIG. 6 is a timing diagram illustrating a defect cell detection operation of a nonvolatile memory device of FIG. 1.

A horizontal axis of FIG. 6 represents time. Referring to FIGS. 1, 3, and 6, a bit line voltage Vcc may be applied to the bit lines BLs, the power supply voltage Vdd may be applied to a string selection line SSL and a ground selection line GSL, and the setting voltage Va may be applied to the word lines WL1, WL2, WL3, and WL4.

The nonvolatile memory device 100 may float the second word line WL2 during a floating time FT. The nonvolatile memory device 100 may float the second word line WL2 at a first time t1 and may maintain a floating state of the second word line WL2 during the floating time FT. The nonvolatile memory device 100 may perform off-cell counting by sensing voltages of the bit lines BLs at a second time t2.

Because the third word line WL3 is not connected with the defect cell DC, the setting voltage Va applied to the third word line WL3 may be maintained even though the third word line WL3 is floated. Under this condition, in the case where the nonvolatile memory device 100 senses voltages of the bit lines BLs to count off-cells, the number of off-cells may be "0". However, because the second word line WL2 is connected with the defect cell DC, the setting voltage Va applied to the second word line WL2 may not be maintained when the second word line WL2 is floated, and the setting voltage Va of the second word line WL2 may decrease. Under this condition, in the case where the nonvolatile memory device 100 senses voltages of the bit lines BLs to count off-cells, the number of off-cells may be 1 or more.

Below, FIGS. 7A to 9C illustrate embodiments where a defect cell detection operation is performed in an erase operation, and FIGS. 10A to 12 illustrate embodiments where a defect cell detection operation is performed in a program operation. A defect cell detection operation to be described with reference to FIGS. 7A to 12 is similar to the defect cell detection operation described with reference to FIGS. 3 to 6, and thus, additional description will be omitted to avoid redundancy.

Figure 7A:
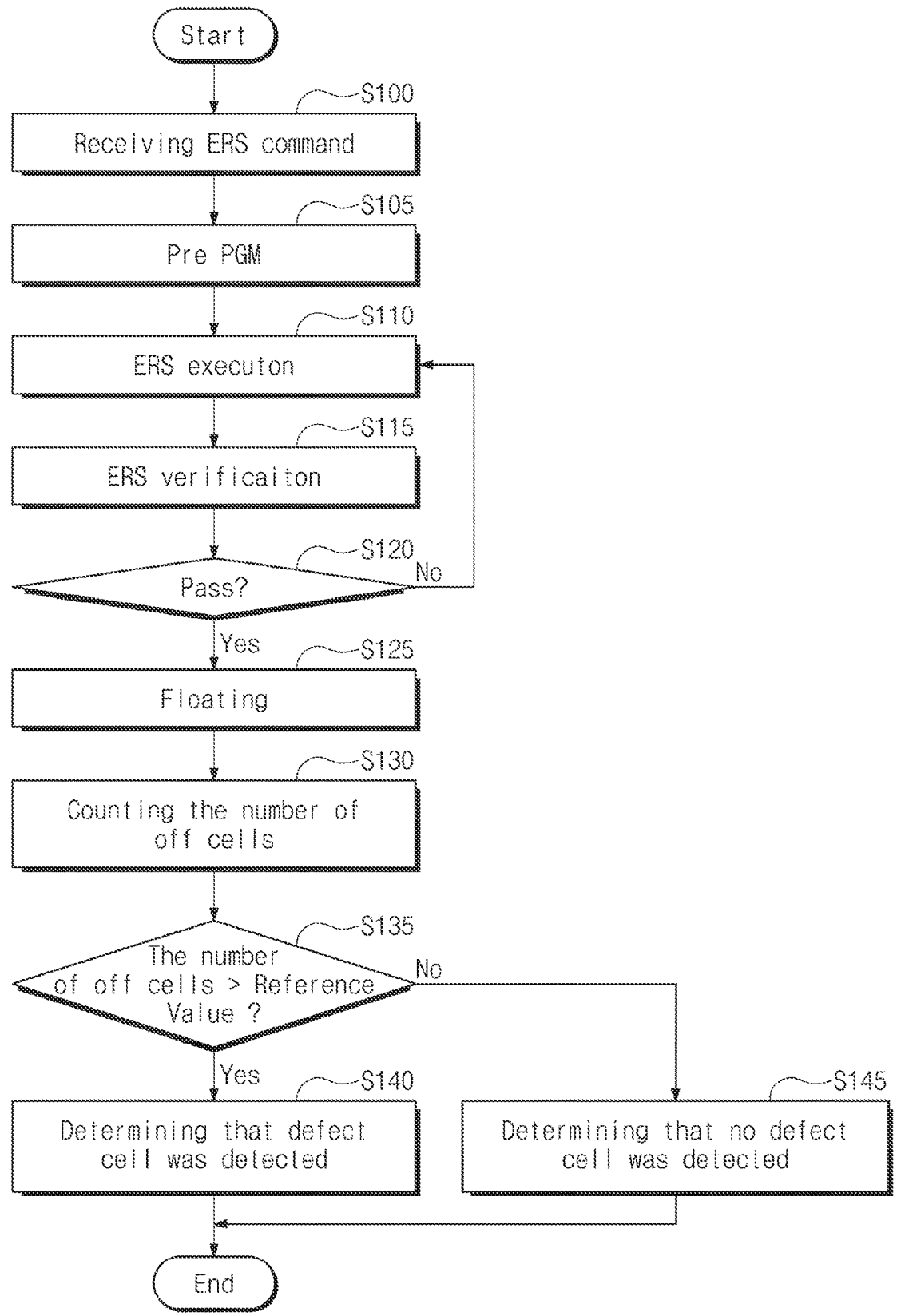
FIGS. 7A to 7C are diagrams illustrating that a defect cell detection operation is performed after an erase operation.
Figure 7B:
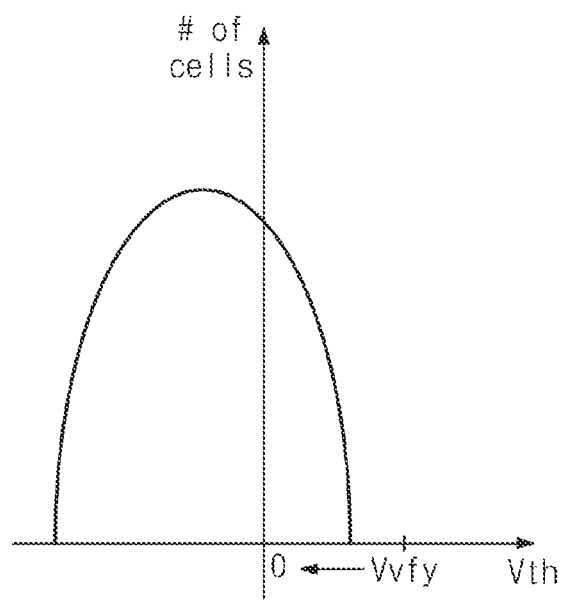
Figure 7C:
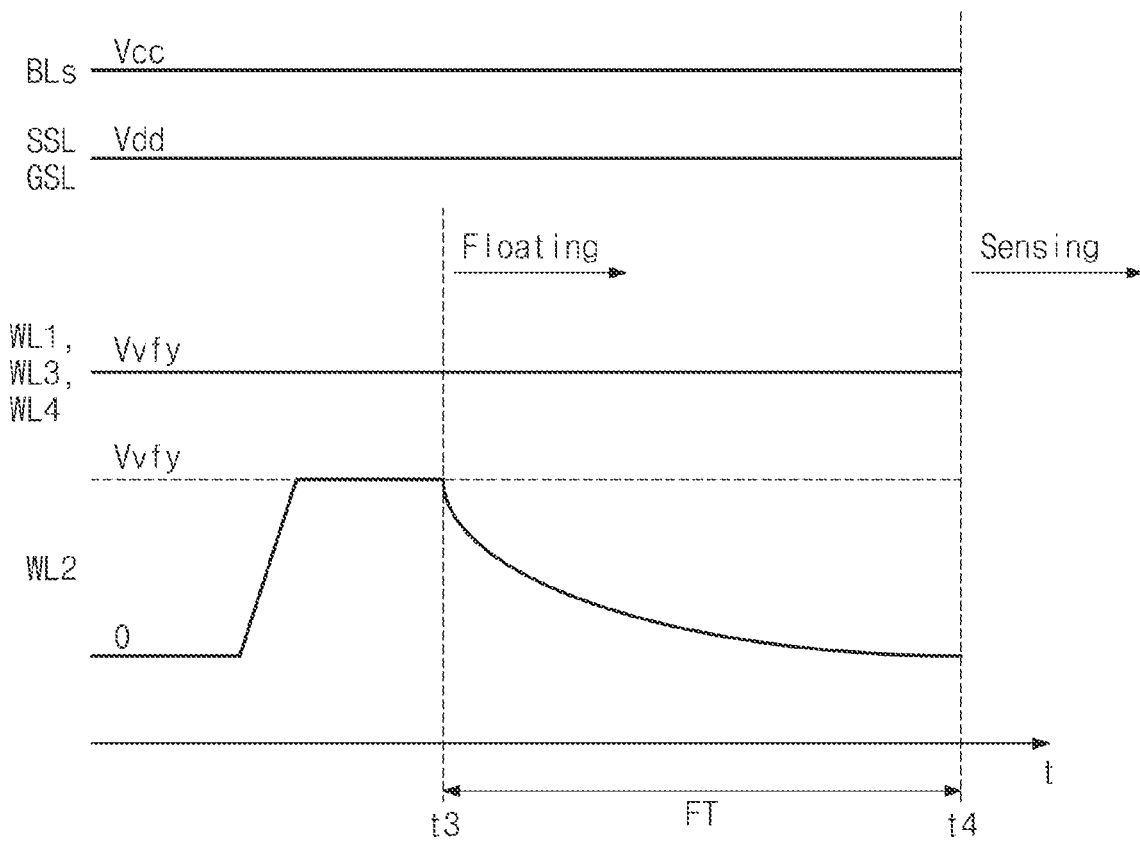

FIGS. 7A to 7C are diagrams for describing an erase operation of a nonvolatile memory device of FIG. 1. In an embodiment, the nonvolatile memory device 100 may be configured to perform the defect cell detection operation described with reference to FIGS. 1 to 6 while performing the erase operation. An embodiment where the nonvolatile memory device 100 performs the defect cell detection operation after the erase operation is completed will be described with reference to FIGS. 7A to 7C.

Referring to FIGS. 3 and 7A to 7C, the nonvolatile memory device 100 may perform the defect cell detection operation after the erase operation is completed. FIG. 7A is a flowchart illustrating an operation method of the nonvolatile memory device 100, FIG. 7B is a diagram illustrating a distribution associated with the second word line WL2, and FIG. 7C is a timing diagram associated with the defect cell detection operation of FIG. 7A. In FIG. 7B, a horizontal axis represents a threshold voltage Vth of a memory cell, and a vertical axis represents the number of memory cells. In FIG. 7C, a horizontal axis represents time "t".

In operation S100, the nonvolatile memory device 100 may receive an erase command from the memory controller. In operation S105, the nonvolatile memory device 100 may perform a pre-program operation on the first memory block BLK1 in response to the erase command. The pre-program operation may be performed to prevent memory cells of a memory block targeted for the erase operation from being excessively erased. Threshold voltages of the memory cells included in the memory block may be increased by the pre-program operation as much as a given level under the same bias condition as a normal program operation.

In operation S110, the nonvolatile memory device 100 may perform the erase operation on the first memory block BLK1. The erase operation may be performed in units of a block, and the nonvolatile memory device 100 may apply an erase voltage to the first memory block BLK1. In the case where the erase voltage is applied to the first memory block BLK1, threshold voltages of memory cells of the first memory block BLK1 may decrease. A bias condition for the erase operation is well known, and thus, additional description will be omitted to avoid redundancy.

In operation S115, an erase verification operation may be performed to verify whether the first memory block BLK1 is normally erased. The nonvolatile memory device 100 may apply an erase verification voltage to word lines connected with the first memory block BLK1 and may verify whether memory cells having a threshold voltage greater than the erase verification voltage exist. A bias condition for the erase verification operation is similar to that of a normal read operation, and thus, additional description will be omitted to avoid redundancy.

In operation S120, whether the erase operation of the first memory block BLK1 passes or fails may be determined. When it is determined that a memory cell having a threshold voltage greater than the erase verification voltage does not exist, the nonvolatile memory device 100 may determine the erase operation as a pass; when it is determined that a memory cell having a threshold voltage greater than the erase verification voltage exists, the nonvolatile memory device 100 may determine the erase operation as a fail and may then proceed to operation S110.

In operation S125, in response to determining the erase operation is determined as a pass, the nonvolatile memory device 100 may apply a setting voltage to the first to fourth word lines WL1 to WL4 and may float the first to fourth word lines WL1 to WL4 during a floating time. The nonvolatile memory device 100 may apply the setting voltage to the first to fourth word lines WL1 to WL4.

In the case where the erase operation is completed, that is, in the case where the erase operation is determined as a pass, threshold voltages of the memory cells of the first memory block BLK1 are smaller than an erase verification voltage Vvfy. Therefore, to determine the occurrence of an off-cell based on the setting voltage, the setting voltage may correspond to the erase verification voltage Vvfy. However, the setting voltage is not limited thereto. For example, a magnitude of the setting voltage may be greater than a magnitude of the erase verification voltage Vvfy.

In operation S130, the nonvolatile memory device 100 may count the number of off-cells connected with the first to fourth word lines WL1 to WL4. In operation S135, the nonvolatile memory device 100 may determine whether the number of off-cells thus counted is more than the reference value. When it is determined that the number of off-cells thus counted is more than the reference value, in operation S140, the nonvolatile memory device 100 may determine that a defect cell is detected. When it is determined that the number of off-cells thus counted is equal to or less than the reference value, in operation S145, the nonvolatile memory device 100 may determine that a defect cell is not detected.

Referring to FIG. 7B, when the second word line WL2 is floated, a word line voltage of the second word line WL2 may decrease from the erase verification voltage Vvfy to 0 V. In this case, memory cells, of which threshold voltages are greater than 0 V, from among memory cells connected with the second word line WL2 may be counted as off-cells, and thus, that a defect cell is detected may be determined.

Referring to FIG. 7C, as a setting voltage, the erase verification voltage Vvfy may be applied to the first to fourth word lines WL1 to WL4 and the first to fourth word lines WL1 to WL4 may be then floated during the floating time FT from a third time t3. The floating time FT may be from the third time t3 to a fourth time t4. In this case, a voltage drop may occur at the second word line WL2 connected with the defect cell DC. The nonvolatile memory device 100 may perform off-cell counting by sensing voltages of the bit lines BLs at the fourth time t4.

Figure 8A:
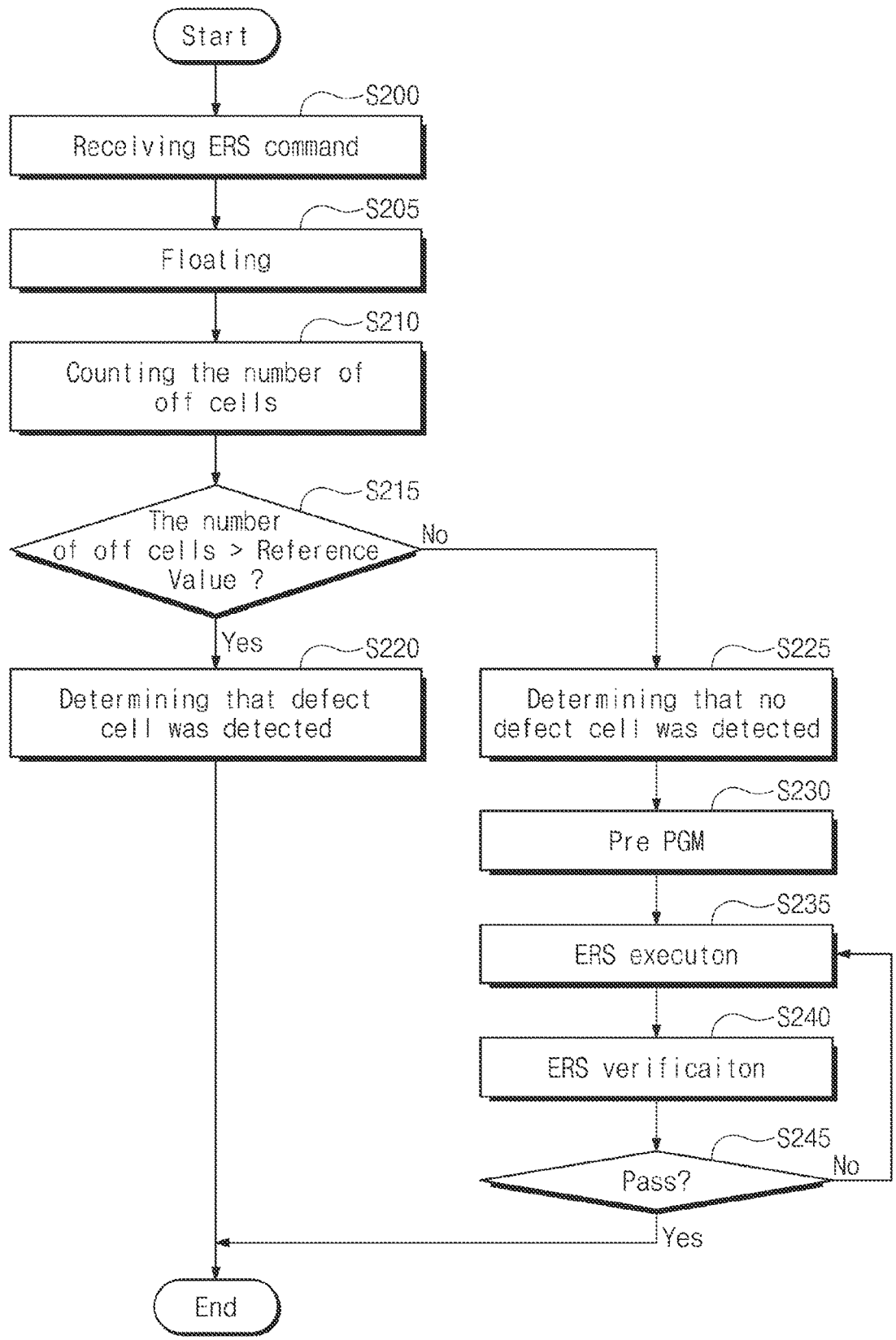
FIGS. 8A to 8C are diagrams illustrating that a defect cell detection operation is performed before an erase operation.
Figure 8B:
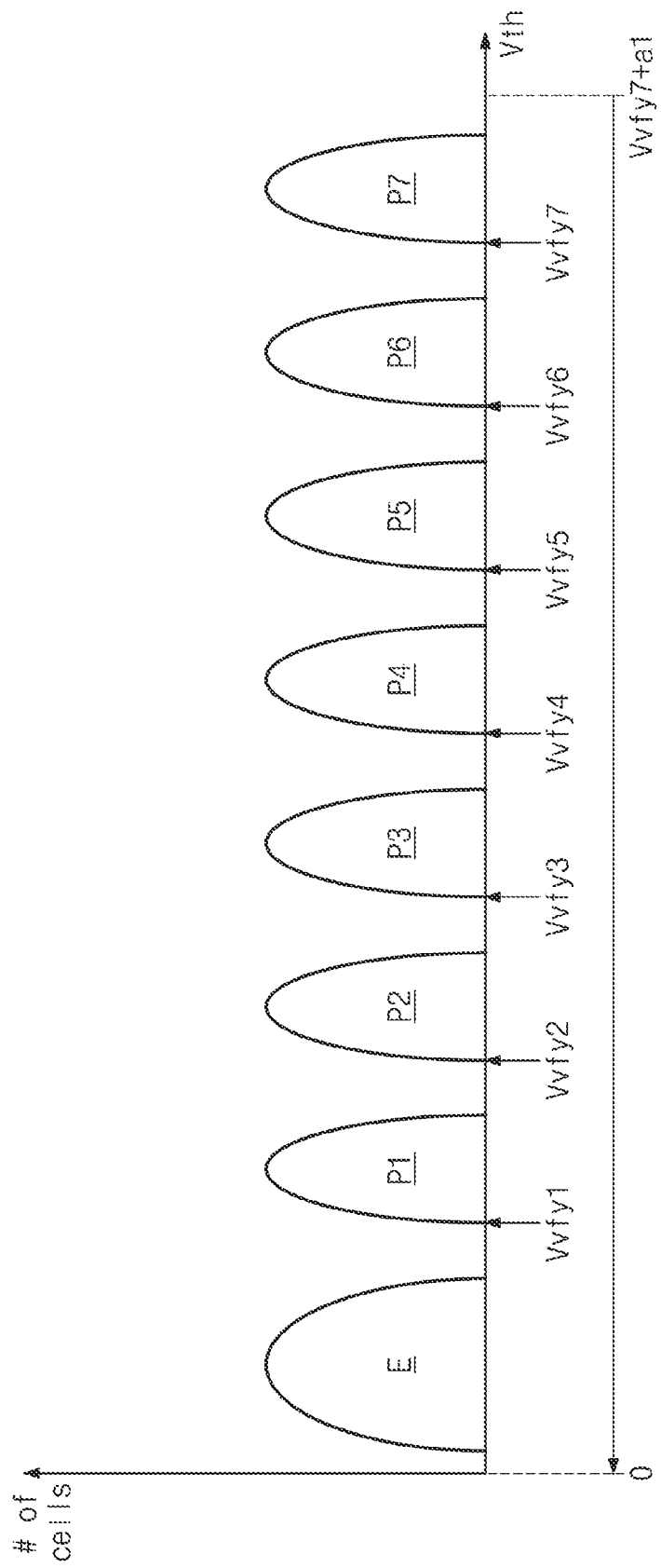
Figure 8C:
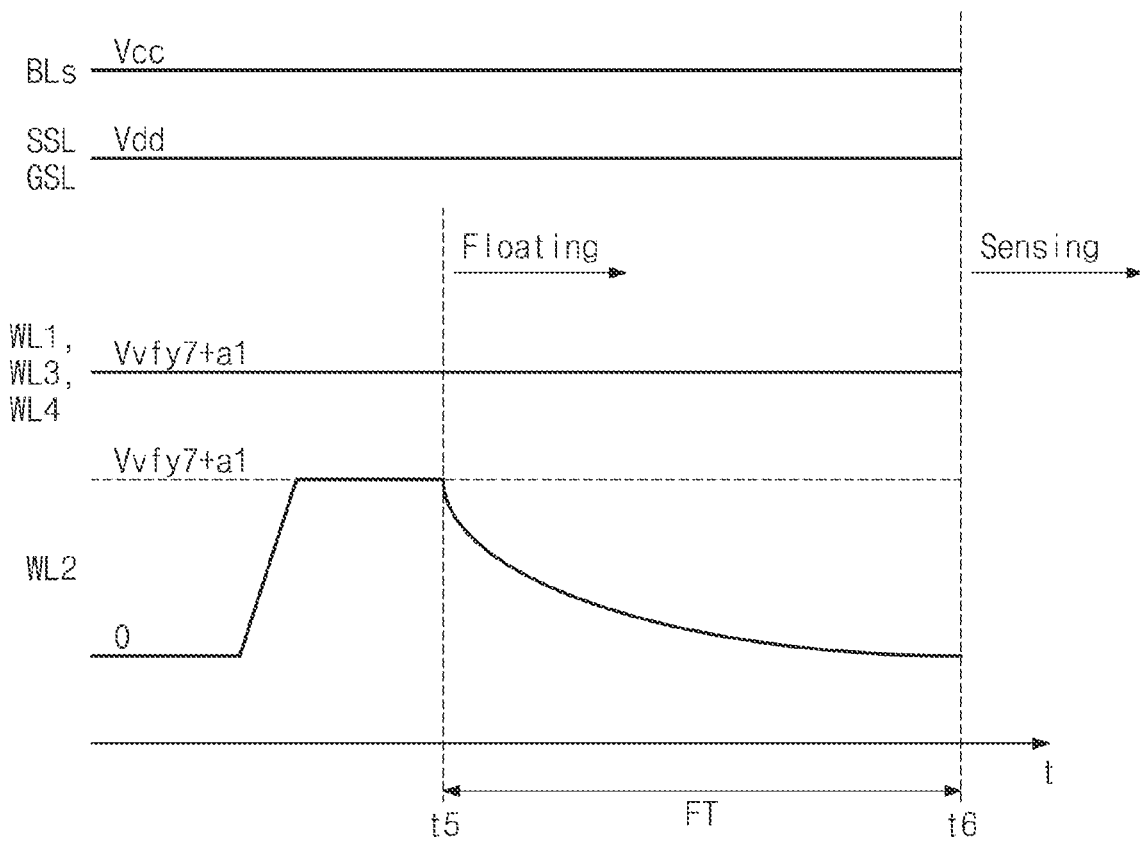

FIGS. 8A to 8C are diagrams for describing an erase operation of a nonvolatile memory device of FIG. 1. In an embodiment, as described above, the nonvolatile memory device 100 may be configured to perform the defect cell detection operation described with reference to FIGS. 1 to 6 while performing the erase operation. An embodiment where the nonvolatile memory device 100 performs the defect cell detection operation before the erase operation is performed will be described with reference to FIGS. 8A to 8C.

Referring to FIGS. 3 and 8A to 8C, the nonvolatile memory device 100 may perform the defect cell detection operation before the erase operation. FIG. 8A is a flowchart illustrating an operation method of the nonvolatile memory device 100, FIG. 8B is a diagram illustrating a distribution associated with the second word line WL2, and FIG. 8C is a timing diagram associated with the defect cell detection operation of FIG. 8A. In FIG. 8B, a horizontal axis represents a threshold voltage Vth of a memory cell, and a vertical axis represents the number of memory cells. In FIG. 8C, a horizontal axis represents time "t".

In operation S200, the nonvolatile memory device 100 may receive the erase command from the memory controller. In operation S205, the nonvolatile memory device 100 may float the first to fourth word lines WL1 to WL4 at a setting voltage during a floating time in response to the erase command. In an embodiment, before floating the first to fourth word lines WL1 to WL4, the nonvolatile memory device 100 may apply the setting voltage to the first to fourth word lines WL1 to WL4.

In operation S210, the nonvolatile memory device 100 may count the number of off-cells connected with the first to fourth word lines WL1 to WL4. In operation S215, the nonvolatile memory device 100 may determine whether the number of off-cells thus counted is more than the reference value. When it is determined that the number of off-cells thus counted is more than the reference value, in operation S220, the nonvolatile memory device 100 may determine that a defect cell is detected. When it is determined that the number of off-cells thus counted is equal to or less than the reference value, in operation S225, the nonvolatile memory device 100 may determine that a defect cell is not detected.

In operation S230, the nonvolatile memory device 100 may perform the pre-program operation on the first memory block BLK1 in response to determining that a defect cell is not detected. In operation S235, the nonvolatile memory device 100 may perform the erase operation on the first memory block BLK1. In operation S240, the erase verification operation may be performed to verify whether the first memory block BLK1 is normally erased. In operation S245, whether the erase operation of the first memory block BLK1 passes or fails may be determined. When a determination result indicates that the erase operation of the first memory block BLK1 passes, the erase operation may end; when the determination result indicates that the erase operation of the first memory block BLK1 fails, the process may proceed to operation S235.

The operation method of FIG. 8A is similar to the operation method of the nonvolatile memory device 100 described with reference to FIG. 7A except that the order of performing the erase operation and the defect cell detection operation is changed, and thus, additional description associated with each operation will be omitted to avoid redundancy.

In an embodiment, the setting voltage may be greater than a program verification voltage. Before the erase operation is performed, the memory cells of the first memory block BLK1 may be in a programmed state. In this case, to determine the occurrence of off-cells based on the setting voltage, the nonvolatile memory device 100 may set the setting voltage to be higher than the program verification voltage corresponding to a program state.

Referring to FIG. 8B, the memory cells of FIG. 3 may be a triple level cell (TLC). In this case, each of the memory cells may be programmed to have one of an erase state "E" and first to seventh program states P1 to P7 through the program operation. Whether the memory cells are programmed to the first to seventh program states P1 to P7 may be verified by using first to seventh program verification voltages Vvfy1, Vvfy2, Vvfy3, Vvfy4, Vvfy5, Vvfy6, and Vvfy7.

A setting voltage may be set to be greater than the seventh program verification voltage Vvfy7, corresponding to the seventh program state P7 which is the highest program state, by as much as a first setting value a1, that is, may be set to "Vvfy7+a1". The setting voltage "Vvfy7+a1" may be set to be greater than threshold voltage values of the seventh program state P7 for the purpose of determining the occurrence of off-cells based on the setting voltage "Vvfy7+a1".

A time when floating is maintained may be set to be proportional to a magnitude of the setting voltage "Vvfy7+a1". The nonvolatile memory device 100 may set the floating time FT proportional to the setting voltage "Vvfy7+a1" such that a word line voltage sufficiently decreases from the applied setting voltage "Vvfy7+a1" to 0 V after the floating of word lines. When the second word line WL2 is floated, a word line voltage of the second word line WL2 may decrease from the applied setting voltage "Vvfy7+a1" to 0 V.

Referring to FIG. 8C, the setting voltage "Vvfy7+a1" may be applied to the first to fourth word lines WL1 to WL4 and the first to fourth word lines WL1 to WL4 may be then floated during the floating time FT from a fifth time t5. The floating time FT may be from the fifth time t5 to a sixth time t6. In this case, a voltage drop may occur at the second word line WL2 connected with the defect cell DC. The nonvolatile memory device 100 may perform off-cell counting by sensing voltages of the bit lines BLs at the sixth time t6.

Figure 9A:
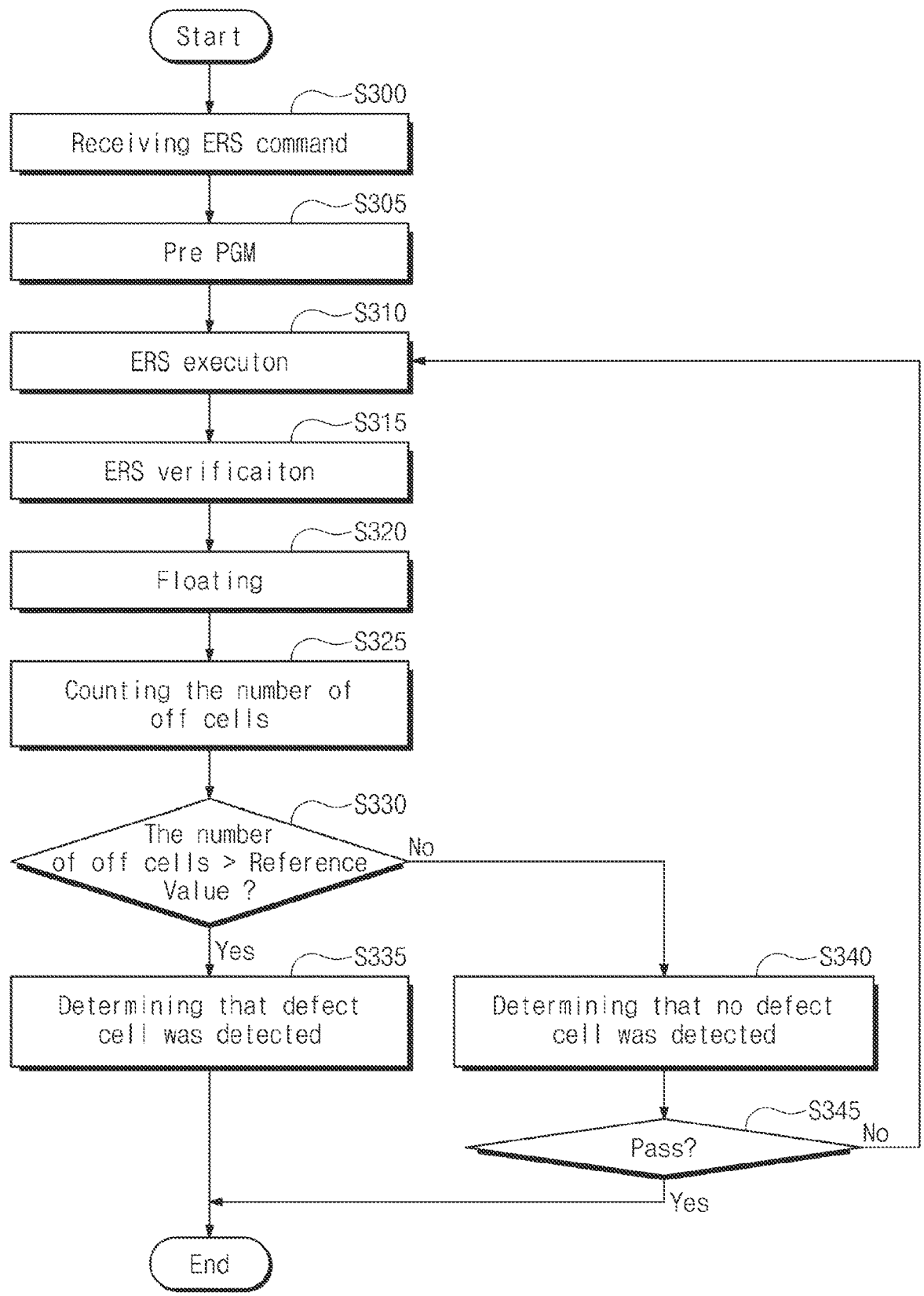
FIGS. 9A to 9C are diagrams illustrating that a defect cell detection operation is performed during an erase operation.
Figure 9B:
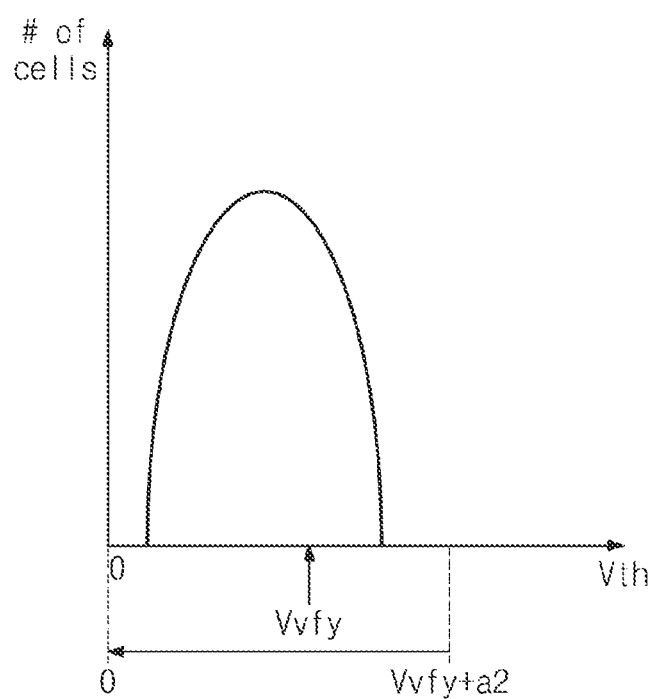
Figure 9C:
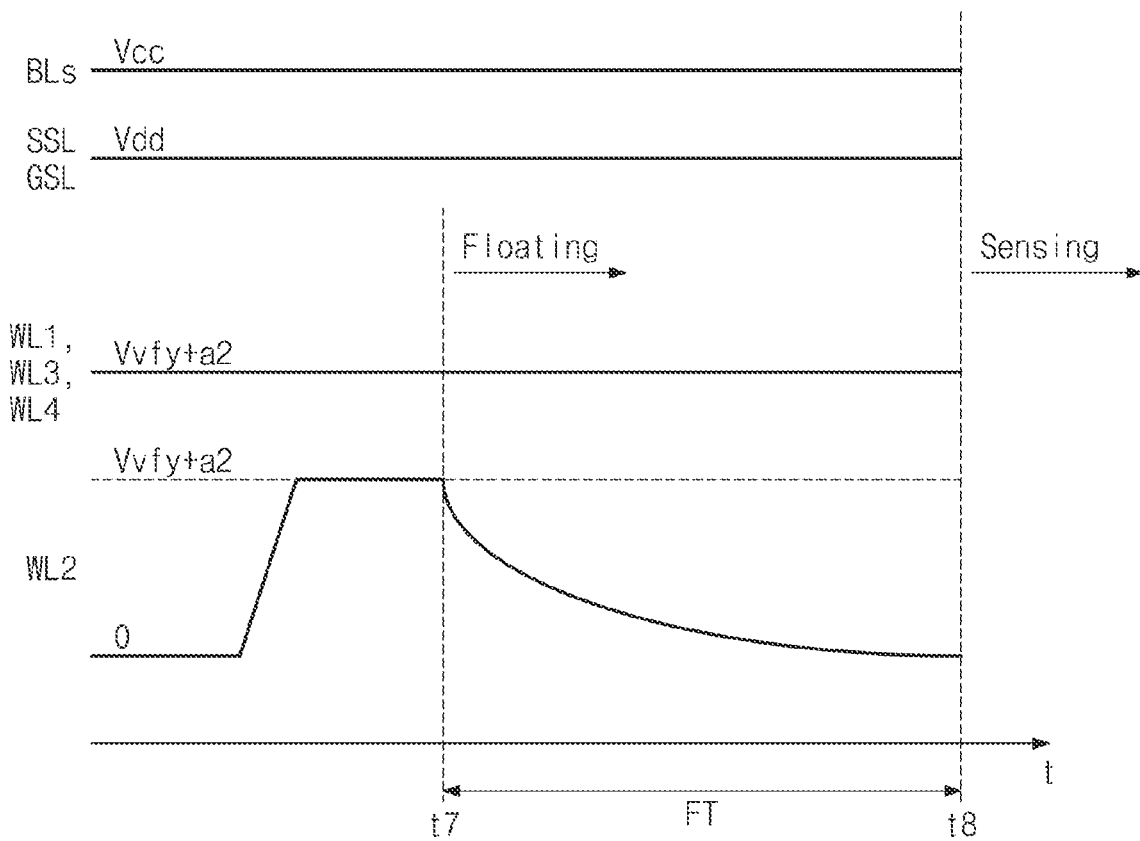

FIGS. 9A to 9C are diagrams for describing an erase operation of a nonvolatile memory device of FIG. 1. In an embodiment, as described above, the nonvolatile memory device 100 may be configured to perform the defect cell detection operation described with reference to FIGS. 1 to 6 while performing the erase operation. An embodiment where the nonvolatile memory device 100 performs the defect cell detection operation while performing the erase operation will be described with reference to FIGS. 9A to 9C.

Referring to FIGS. 3 and 9A to 9C, the nonvolatile memory device 100 may perform the defect cell detection operation during the erase operation. FIG. 9A is a flowchart illustrating an operation method of the nonvolatile memory device 100, FIG. 9B is a diagram illustrating a distribution associated with the second word line WL2, and FIG. 9C is a timing diagram associated with a defect cell detection operation of FIG. 9A. In FIG. 9B, a horizontal axis represents a threshold voltage Vth of a memory cell and a vertical axis represents the number of memory cells. In FIG. 9C, a horizontal axis represents time "t".

In operation S300, the nonvolatile memory device 100 may receive the erase command from the memory controller. In operation S305, the nonvolatile memory device 100 may perform the pre-program operation on the first memory block BLK1. In operation S310, the nonvolatile memory device 100 may perform the erase operation on the first memory block BLK1. In operation S315, the erase verification operation may be performed to verify whether the first memory block BLK1 is normally erased.

In operation S320, the nonvolatile memory device 100 may float the first to fourth word lines WL1 to WL4 at a setting voltage during a floating time. In an embodiment, before floating the first to fourth word lines WL1 to WL4, the nonvolatile memory device 100 may apply the setting voltage to the first to fourth word lines WL1 to WL4. In operation S325, the nonvolatile memory device 100 may count the number of off-cells connected with the first to fourth word lines WL1 to WL4. In operation S330, the nonvolatile memory device 100 may determine whether the number of off-cells thus counted is more than the reference value. When it is determined that the number of off-cells thus counted is more than the reference value, in operation S335, the nonvolatile memory device 100 may determine that a defect cell is detected. When it is determined that the number of off-cells thus counted is equal to or less than the reference value, in operation S340, the nonvolatile memory device 100 may determine that a defect cell is not detected.

In operation S345, whether the erase operation of the first memory block BLK1 passes or fails may be determined in response to a determination result indicating that a defect cell is not detected. When a determination result indicates that the erase operation of the first memory block BLK1 passes, the erase operation may end; when the determination result indicates that the erase operation of the first memory block BLK1 fails, the process may proceed to operation S310.

The operation method of FIG. 9A is similar to the operation method of the nonvolatile memory device 100 described with reference to FIG. 7A except that the order of performing the erase operation and the defect cell detection operation is changed, and thus, additional description associated with each operation will be omitted to avoid redundancy.

In an embodiment, the setting voltage may be greater than the erase verification voltage Vvfy. While the erase operation is performed, the memory cells of the first memory block BLK1 may not be in an erase state. In this case, to determine the occurrence of off-cells based on the setting voltage, the nonvolatile memory device 100 may set the setting voltage to be higher than the erase verification voltage Vvfy.

Referring to FIG. 9B, a setting voltage may be set to be greater than the erase verification voltage Vvfy as much as a second setting value a2, that is, may be set to "Vvfy+a2". The setting voltage "Vvfy+a2" may be set to be greater than the erase verification voltage Vvfy for the purpose of determining the occurrence of off-cells based on the setting voltage "Vvfy+a2". The nonvolatile memory device 100 may set a floating time proportional to the applied setting voltage "Vvfy+a2" such that a word line voltage sufficiently decreases from the applied setting voltage "Vvfy+a2" to 0 V after the floating of word lines. When the second word line WL2 is floated, a word line voltage of the second word line WL2 may decrease from the applied setting voltage "Vvfy+a2" to 0 V.

Referring to FIG. 9C, the setting voltage "Vvfy+a2" may be applied to the first to fourth word lines WL1 to WL4 and the first to fourth word lines WL1 to WL4 may be then floated during the floating time FT from a seventh time t7. The floating time FT may be from the seventh time t7 to an eighth time t8. In this case, a voltage drop may occur at the second word line WL2 connected with the defect cell DC. The nonvolatile memory device 100 may perform off-cell counting by sensing voltages of the bit lines BLs at the eighth time t8.

FIGS. 10A to 10D are diagrams for describing a program operation of a nonvolatile memory device of FIG. 1. In an embodiment, the nonvolatile memory device 100 may be configured to perform the defect cell detection operation described with reference to FIGS. 1 to 6 while performing the program operation. An embodiment where the nonvolatile memory device 100 performs the defect cell detection operation while performing the program operation will be described with reference to FIGS. 10A to 10D.

Figure 10A:
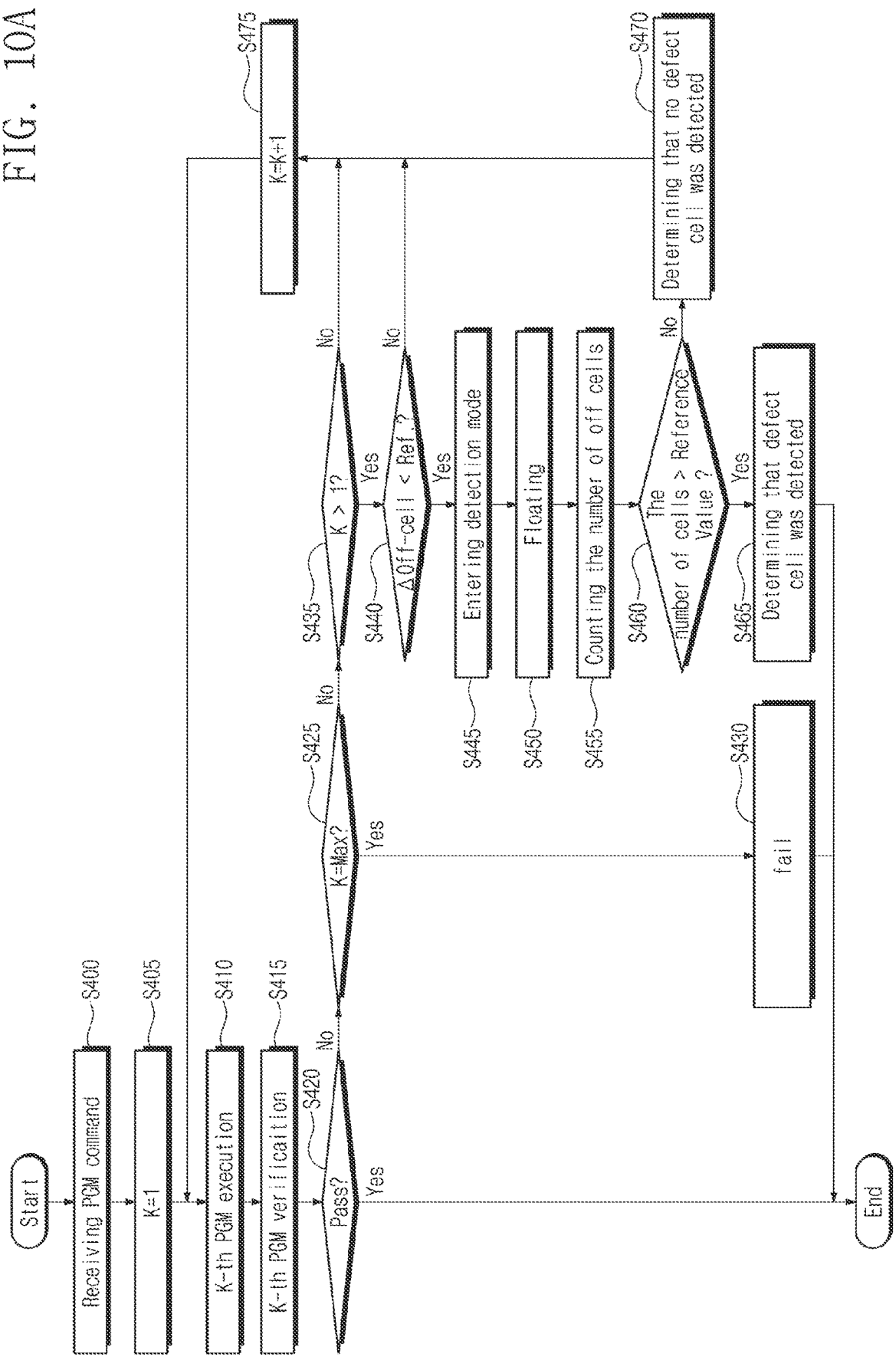
FIGS. 10A to 10D are diagrams illustrating that a defect cell detection operation is performed during a program operation.
Figure 10B:
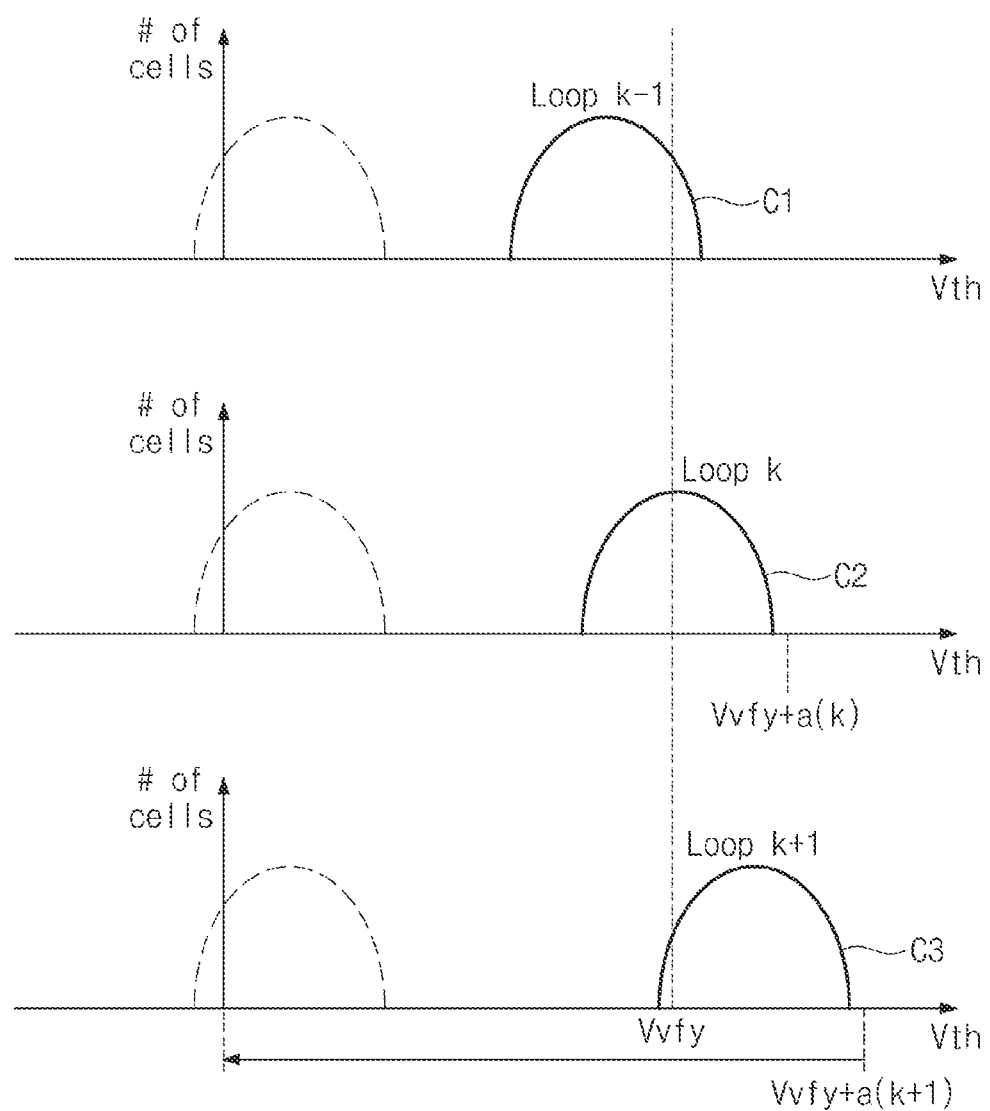
Figure 10C:
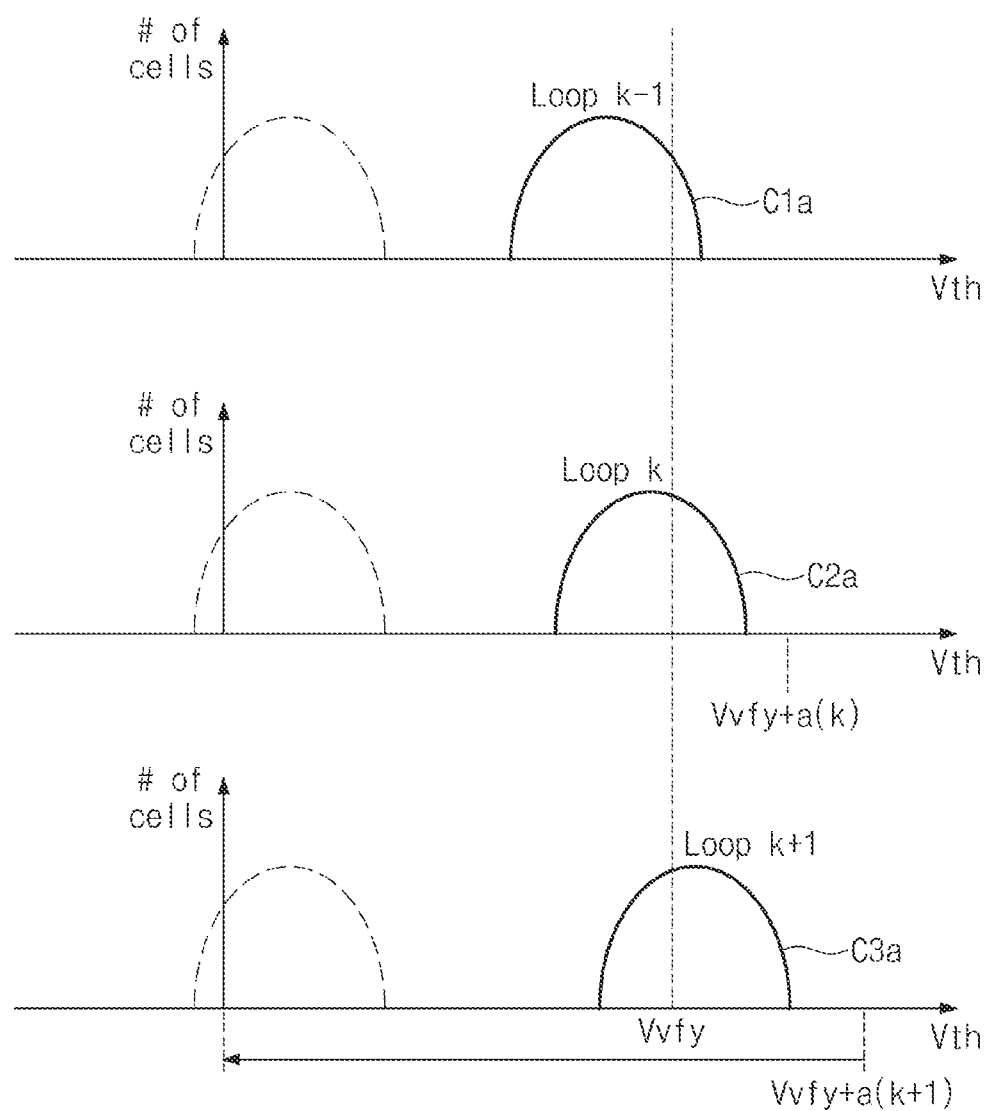
Figure 10D:
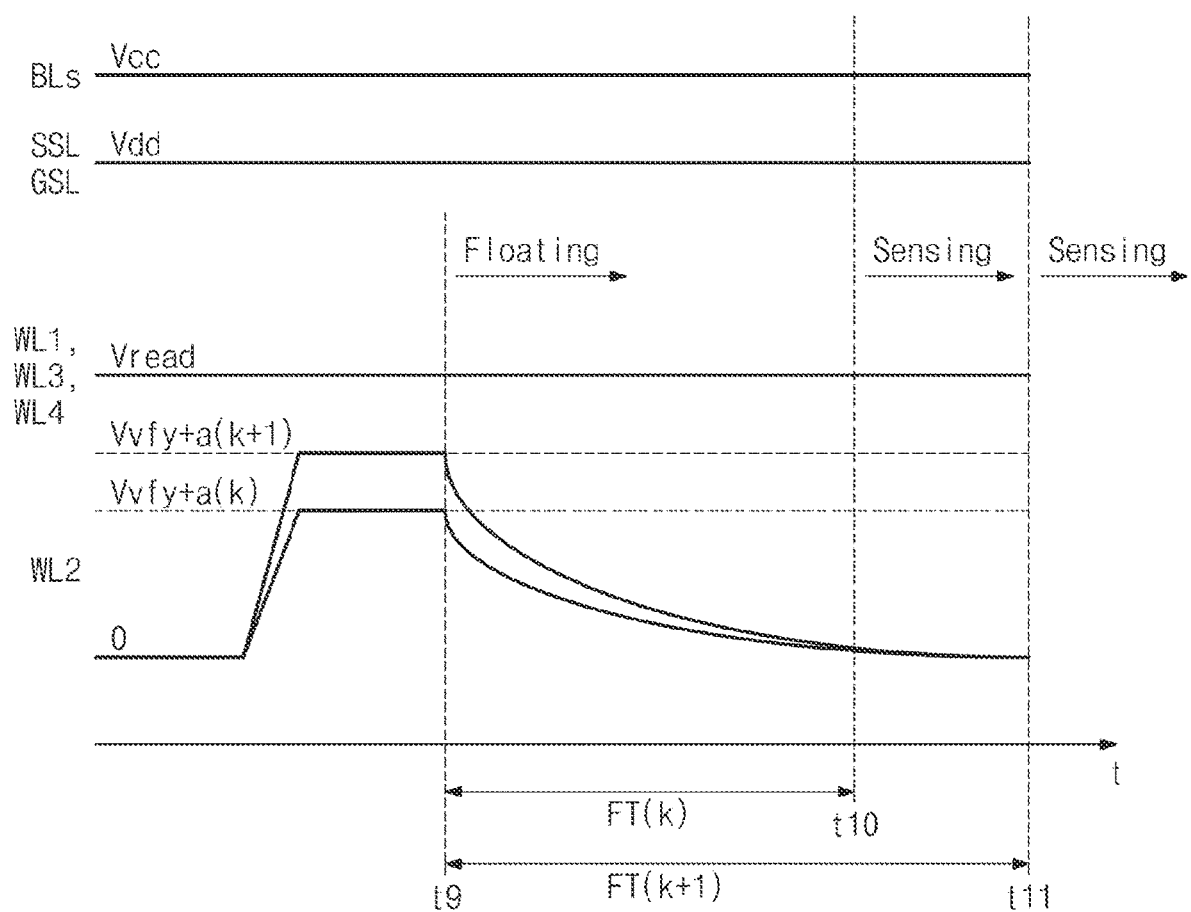

Referring to FIGS. 3 and 10A to 10D, the nonvolatile memory device 100 may perform the defect cell detection operation during the program operation. FIG. 10A is a flowchart illustrating an operation method of the nonvolatile memory device 100, FIGS. 10B and 10C are diagrams illustrating distributions associated with the second word line WL2, and FIG. 10D is a timing diagram associated with the defect cell detection operation of FIG. 10A. In FIGS. 10B and 10C, a horizontal axis represents a threshold voltage Vth of a memory cell, and a vertical axis represents the number of memory cells. In FIG. 10D, a horizontal axis represents time "t".

In operation S400, the nonvolatile memory device 100 may receive the program command from the memory controller. The nonvolatile memory device 100 may perform the program operation in response to the program command. The program operation may be performed to change a threshold voltage of a memory cell through iterative program loops such that the memory cell has an erase state or one of program states.

In operation S405, a program loop may be set to a first program loop (i.e., K indicating a current program loop is set to 1). In operation S410, depending on a bias condition of the first program loop, the nonvolatile memory device 100 may apply a program voltage to the second word line WL2 such that each memory cell has a target threshold voltage. In the case where the program voltage is applied to the second word line WL2, threshold voltages of memory cells of the second word line WL2 may increase. A bias condition for the program operation is well known, and thus, additional description will be omitted to avoid redundancy. In operation S415, a program verification operation may be performed to verify whether the memory cells of the second word line WL2 are normally programmed. The nonvolatile memory device 100 may apply a program verification voltage to the second word line WL2 and may verify whether a memory cell having a threshold voltage smaller than the program verification voltage exists.

In operation S420, whether the program operation of the second word line WL2 passes or fails may be determined. When it is determined that a memory cell having a threshold voltage less than the program verification voltage does not exist, the nonvolatile memory device 100 may determine the program operation as a pass; when it is determined that a memory cell having a threshold voltage less than the program verification voltage exists, the nonvolatile memory device 100 may proceed to operation S425, where a determination is made whether the program loop is a maximum program loop. When it is determined that the program loop is not the maximum program loop, a program loop may be repeated. When it is determined that the program loop is the maximum program loop, in operation S430, a program fail may be determined.

In operation S435, in response to determining that the program loop is not the maximum program loop, the nonvolatile memory device 100 may determine whether K indicating a current program loop is greater than "1". When it is determined that K indicating a current program loop is "1" (i.e., a current program loop is a first program loop), the process may proceed to operation S475, in which K increases as much as "1". That is, a second program loop may be performed.

In operation S440, in response to determining that K indicating a current program loop is 2 or more, the nonvolatile memory device 100 may determine whether a difference between the number of off-cells sensed in a present program loop and the number of off-cells sensed in a previous program loop is smaller than a first reference value. In detail, based on the program verification voltage, the nonvolatile memory device 100 may count the number of off-cells sensed in the first program loop and may count the number of off-cells sensed in the second program loop.

The nonvolatile memory device 100 may calculate a first off-cell count difference being a difference between the number of off-cells sensed in the first program loop and the number of off-cells sensed in the second program loop; when the first off-cell count difference is smaller than the first reference value, the nonvolatile memory device 100 may enter a defect cell detection mode. When the first off-cell count difference is not smaller than the first reference value, the process may proceed to operation S475, in which K increases as much as "1" such that a next program loop is performed.

In this regard, operation S440 may be an operation of determining whether a condition is satisfied for entering the defect cell detection mode during the program operation. A condition for entering the defect cell detection mode will be more fully described with reference to FIGS. 10B and 10C.

After entering the defect cell detection mode in operation S445, the nonvolatile memory device 100 may perform the defect cell detection operation. In operation S450, the nonvolatile memory device 100 may float a selection word line in response to determining the defect cell detection mode is entered in operation S445. For example, the second word line WL2 may be floated at a setting voltage during a floating time. In detail, the nonvolatile memory device 100 may float the second word line WL2 by applying the setting voltage to the second word line WL2 and blocking a current flowing to the second word line WL2 during the floating time. In this case, the setting voltage and the floating time may vary depending on a program loop. For example, as the number of program loops increases (or as K indicating a current program loop increases), the setting voltage and the floating time may increase. How the setting voltage and the floating time are determined depending on a program loop will be more fully described with reference to FIG. 12.

In operation S455, the second number of off-cells being the number of off-cells corresponding to the floated selection word line may be counted. In operation S460, the nonvolatile memory device 100 may compare the second number of off-cells with a second reference value to determine whether the second number of off-cells is more than the second reference value. When it is determined that the second number of off-cells is more than the second reference value, in operation S465, the nonvolatile memory device 100 may determine that a defect cell is detected and may determine the program operation as a fail. When it is determined that the second number of off-cells is equal to or less than the second reference value, in operation S470, the nonvolatile memory device 100 may determine that a defect cell is not detected and the process may proceed to operation S475, in which K increases as much as "1" such that a next program loop is performed.

Referring to FIGS. 10B and 10C, a threshold voltage distribution of the second word line WL2 may change depending on a program loop. As a program loop is repeated, threshold voltages of memory cells connected with the second word line WL2 may increase. The degree to which the threshold voltages of the memory cells increase may vary depending on whether the memory cells connected with the second word line WL2 include a defect cell.

Referring to FIG. 10B, the nonvolatile memory device 100 may count the number of off-cells for each program loop, based on a program verification voltage Vvfy. For example, when a defect is absent from the second word line WL2, a first off-cell count C1 may be obtained in a (k−1)-th program loop, a second off-cell count C2 may be obtained in a k-th program loop, and a third off-cell count C3 may be obtained in a (k+1)-th program loop. Here, as an off-cell count, the number of off-cells may mean the number of memory cells having a threshold voltage greater than the program verification voltage Vvfy. Because the threshold voltages of the memory cells increase as a program loop is repeated, the second off-cell count C2 is greater than the first off-cell count C1, and the third off-cell count C3 is greater than the second off-cell count C2.

The nonvolatile memory device 100 may store a difference between off-cell counts for each program loop in the form of a table. In the case of performing the defect cell detection operation during the program operation, the nonvolatile memory device 100 may calculate a difference between off-cell counts for each program loop, may compare a calculation result with data stored in the table, and may determine whether to enter the defect cell detection mode based on a comparison result.

Referring to FIG. 10C, when a defect cell is connected with the second word line WL2, a 1a-th off-cell count C1a may be obtained in the (k−1)-th program loop, a 2a-th off-cell count C2a may be obtained in the k-th program loop, and a 3a-th off-cell count C3a may be obtained in the (k+1)-th program loop.

In the case where a defect cell is connected with a selection word line, a program operation may not be normally performed. As such, even though a program loop is repeated, threshold voltages of memory cells may fail to increase as much as an expected level. As such, the 2a-th off-cell count C2a may be smaller than the second off-cell count C2, and the 3a-th off-cell count C3a may be smaller than the third off-cell count C3. Therefore, a difference between the 2a-th off-cell count C2a and the 1a-th off-cell count C1a may be smaller than a difference between the second off-cell count C2 and the first off-cell count C1, and a difference between the 3a-th off-cell count C3a and the 2a-th off-cell count C2a may be smaller than a difference between the third off-cell count C3 and the second off-cell count C2. That is, in the case where a defect cell is connected with a selection word line, a decrease in difference may occur between the number of off-cells sensed in the (k+1)-th program loop and the number of off-cells sensed in the k-th program loop, that is, a first off-cell count difference.

When an off-cell count difference for each program loop is smaller than a reference value, the nonvolatile memory device 100 may enter the defect cell detection mode. In the case of performing the defect cell detection operation during the program operation, the nonvolatile memory device 100 may efficiently detect a defect cell by adding an operation of determining whether to enter the defect cell detection mode during the program operation, which is described in operation S440.

Referring to FIG. 10D, the second word line WL2 may be floated at a setting voltage greater than the program verification voltage Vvfy. The setting voltage may increase as a program loop is repeated. For example, a setting voltage of the k-th program loop may be greater than the program verification voltage Vvfy by as much as a first setting value a(k). A setting voltage of the (k+1)-th program loop may be greater than the program verification voltage Vvfy by as much as a second setting value a(k+1). In an embodiment, the second setting value a(k+1) may be greater than the first setting value a(k) by as much as a word line voltage increment according to an incremental step pulse programming (ISPP) manner.

The second word line WL2 may be floated at the setting voltage greater than the program verification voltage Vvfy during a floating time. The floating time may increase as a program loop is repeated. For example, a floating time FT(k) corresponding to the k-th program loop may be from a ninth time t9 to a tenth time t10. A floating time FT(k+1) corresponding to the (k−1)-th program loop may be from the ninth time t9 to an eleventh time t11.

As illustrated in FIG. 10D, the floating time FT(k) corresponding to the k-th program loop may be shorter than the floating time FT(k+1) corresponding to the (k+1)-th program loop. The reason is that the setting voltage "Vvfy+a(k+1)" corresponding to the (k+1)-th program loop may be greater than the setting voltage "Vvfy+a(k)" corresponding to the k-th program loop. That is, as the number of program loops increases, the setting voltage and the floating time may increase.

Figure 11:
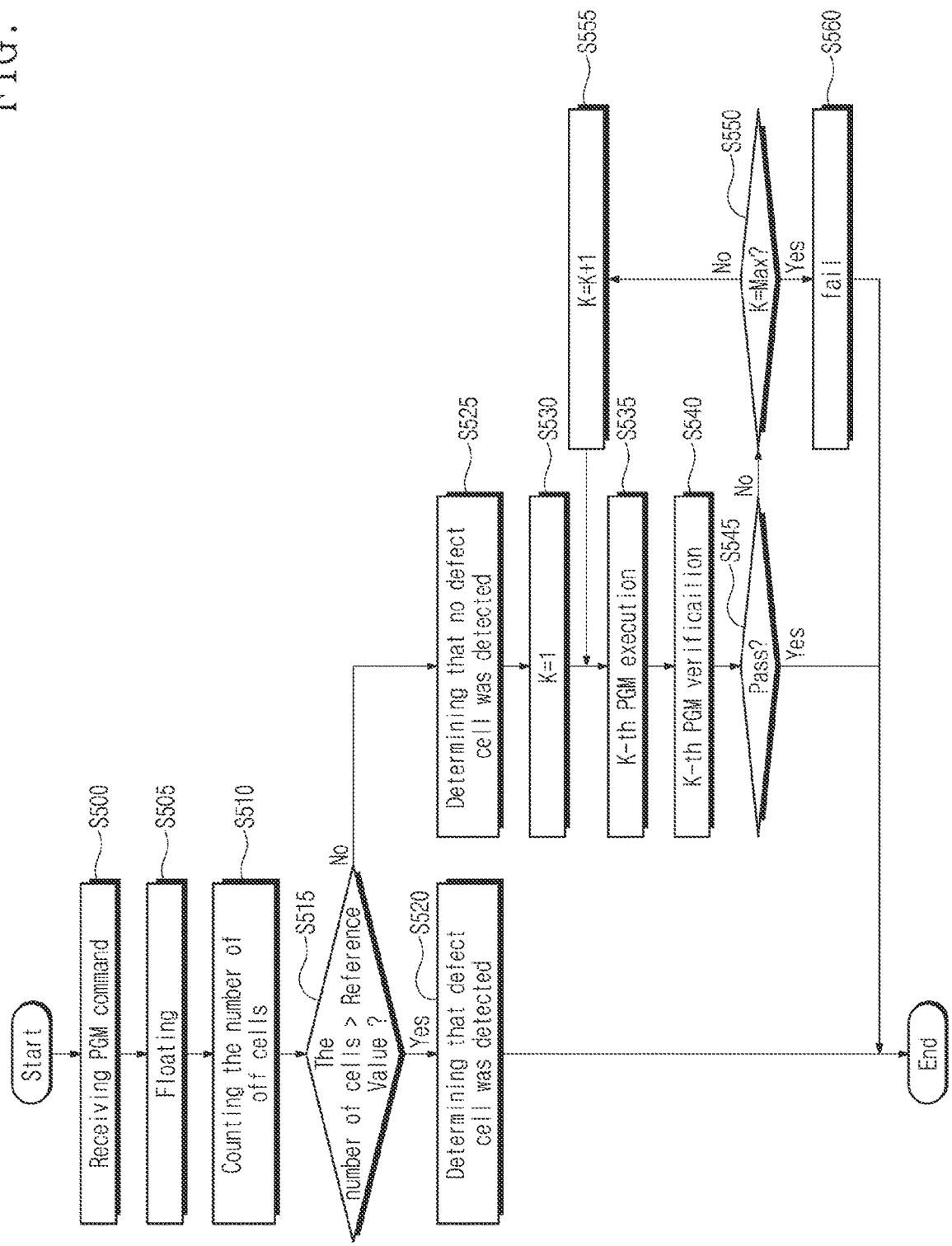
FIG. 11 is a diagram illustrating that a defect cell detection operation is performed before a program operation.

FIG. 11 is a diagram for describing a program operation of a nonvolatile memory device of FIG. 1. In an embodiment, as described above, the nonvolatile memory device 100 may be configured to perform the defect cell detection operation described with reference to FIGS. 1 to 6 while performing the program operation. An embodiment where the nonvolatile memory device 100 performs the defect cell detection operation before performing the program operation will be described with reference to FIG. 11.

Referring to FIG. 11, in operation S500, the nonvolatile memory device 100 may receive the program command from the memory controller. In operation S505, in response to the program command, the nonvolatile memory device 100 may apply a setting voltage to the first to fourth word lines WL1 to WL4 and may float the first to fourth word lines WL1 to WL4 during a floating time. In operation S510, the nonvolatile memory device 100 may count the number of off-cells connected with the first to fourth word lines WL1 to WL4. In operation S515, the nonvolatile memory device 100 may determine whether the number of off-cells thus counted is more than the reference value. When it is determined that the number of off-cells thus counted is more than the reference value, in operation S520, the nonvolatile memory device 100 may determine that a defect cell is detected. When it is determined that the number of off-cells thus counted is equal to or less than the reference value, in operation S525, the nonvolatile memory device 100 may determine that a defect cell is not detected.

In operation S530, K indicating a current program loop may be set to "1" in response to determining that a defect cell is not detected, such that a first program loop is performed; in operation S535, the nonvolatile memory device 100 may perform programming corresponding to the first program loop. In operation S540, the program verification operation may be performed to verify whether the memory cells of the second word line WL2 are normally programmed. In operation S545, whether the program operation of the second word line WL2 passes or fails may be determined. When a determination result indicates that the program operation of the second word line WL2 passes, the program operation may end; when the determination result indicates that the program operation of the second word line WL2 fails, the process may proceed to operation S550, which determines whether K indicating a current program loop is a maximum program loop. When it is determined that K indicating a current program loop is not the maximum program loop, the process may proceed to operation S555, in which K increases by as much as "1" to perform a next program loop; when it is determined that K indicating a current program loop is the maximum program loop, the process may proceed to operation S560, in which the program operation is determined as a fail.

The operation method of FIG. 11 is similar to the operation method of the nonvolatile memory device 100 described with reference to FIG. 10A except that the order of performing the program operation and the defect cell detection operation is changed, and thus, additional description associated with each operation will be omitted to avoid redundancy.

A distribution diagram and a timing diagram associated with the defect cell detection operation before the program operation may be similar to the distribution diagram (refer to FIG. 7B) and the timing diagram (refer to FIG. 7C) associated with the defect cell detection operation after the erase operation. Therefore, a setting voltage and a floating time of the defect cell detection operation before the program operation may be similar to a setting voltage and a floating time of the defect cell detection operation after the erase operation.

Figure 12:
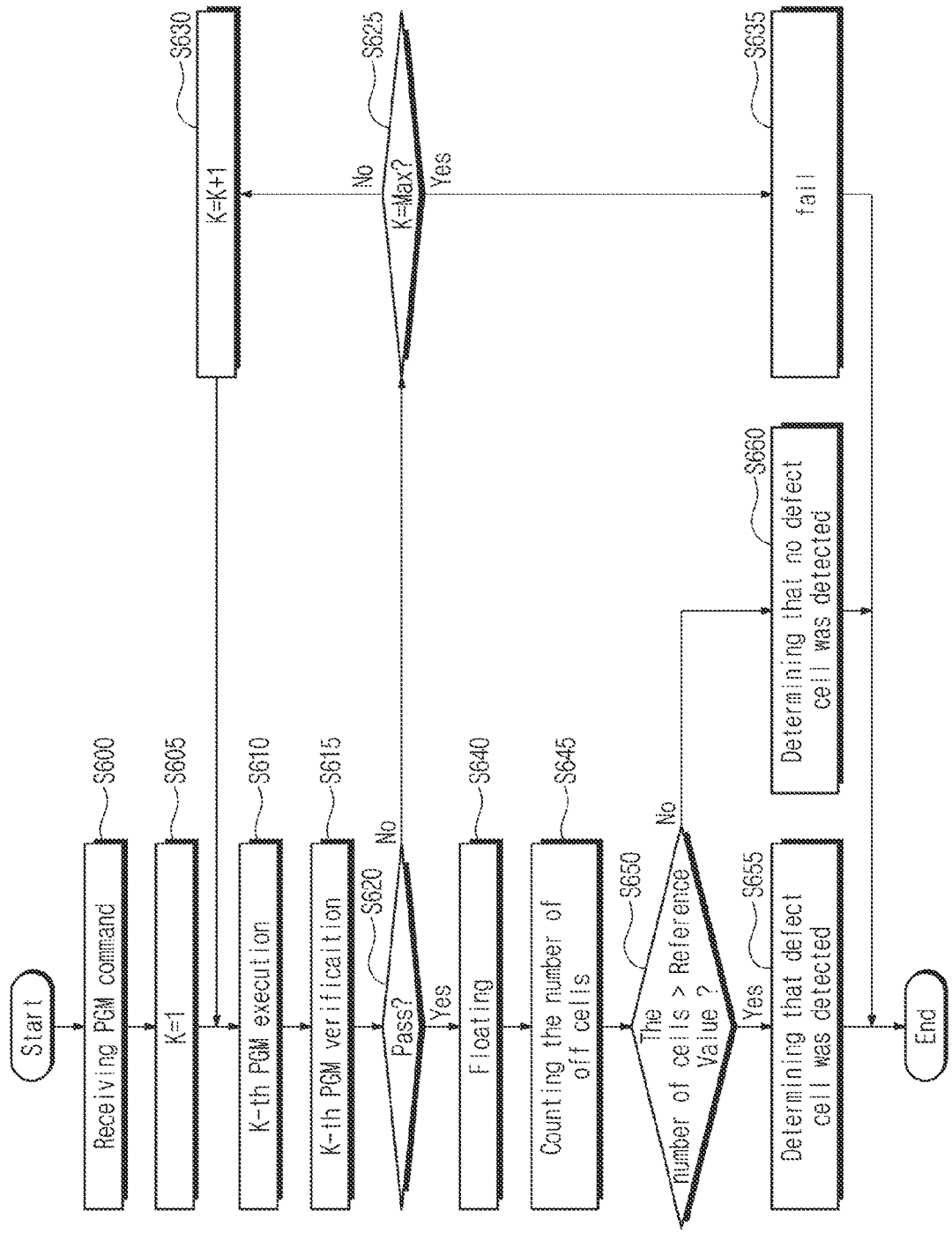
FIG. 12 is a diagram illustrating that a defect cell detection operation is performed after a program operation.

FIG. 12 is a diagram for describing a program operation of a nonvolatile memory device of FIG. 1. In an embodiment, as described above, the nonvolatile memory device 100 may be configured to perform the defect cell detection operation described with reference to FIGS. 1 to 6 while performing the program operation. An embodiment where the nonvolatile memory device 100 performs the defect cell detection operation after performing the program operation will be described with reference to FIG. 12.

Referring to FIG. 12, in operation S600, the nonvolatile memory device 100 may receive the program command from the memory controller. In operation S605, K indicating a current program loop may be set to "1" such that a first program loop is performed; in operation S610, the nonvolatile memory device 100 may perform programming corresponding to the first program loop. In operation S615, the program verification operation may be performed to verify whether the memory cells of the second word line WL2 are normally programmed. In operation S620, whether the program operation of the second word line WL2 passes or fails may be determined. When a determination result indicates that the program operation of the second word line WL2 passes, the defect cell detection operation may be performed; when the determination result indicates that the program operation of the second word line WL2 fails, the process may proceed to operation S625, in which there is determined whether K indicating a current program loop is a maximum program loop. When it is determined that K indicating a current program loop is not the maximum program loop, the process may proceed to operation S630, in which K increases by as much as "1" to perform a next program loop; when it is determined that K indicating a current program loop is the maximum program loop, the process may proceed to operation S635, in which the program operation is determined as a fail.

In operation S640, in response to determining that the program operation is a pass, the nonvolatile memory device 100 may apply a setting voltage to the second word line WL2 and may float the second word line WL2 during a floating time. In operation S645, the nonvolatile memory device 100 may count the number of off-cells connected with the second word line WL2. In operation S650, the nonvolatile memory device 100 may determine whether the number of off-cells thus counted is more than the reference value. When it is determined that the number of off-cells thus counted is more than the reference value, in operation S655, the nonvolatile memory device 100 may determine that a defect cell is detected. When it is determined that the number of off-cells thus counted is equal to or less than the reference value, in operation S660, the nonvolatile memory device 100 may determine that a defect cell is not detected.

The operation method of FIG. 12 is similar to the operation method of the nonvolatile memory device 100 described with reference to FIG. 10A except that the order of performing the program operation and the defect cell detection operation is changed, and thus, additional description associated with each operation will be omitted to avoid redundancy.

A distribution diagram and a timing diagram associated with the defect cell detection operation after the program operation may be similar to the distribution diagram (refer to FIG. 8B) and the timing diagram (refer to FIG. 8C) associated with the defect cell detection operation before the erase operation. Therefore, a setting voltage and a floating time of the defect cell detection operation after the program operation may be similar to a setting voltage and a floating time of the defect cell detection operation before the erase operation.

Figure 13:
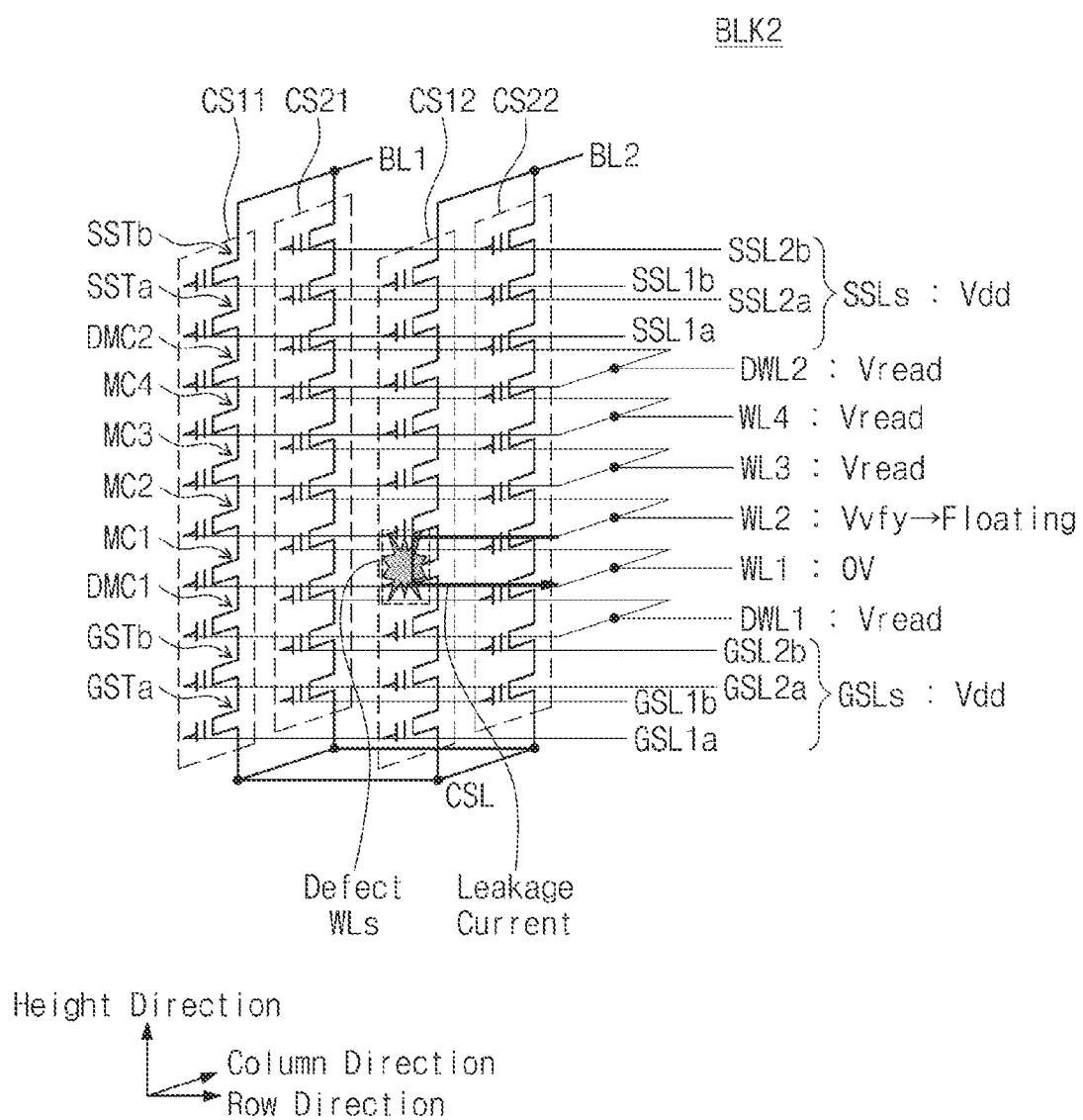
FIGS. 13 and 14 are diagrams for describing another embodiment of a nonvolatile memory device according to the present disclosure.
Figure 14:
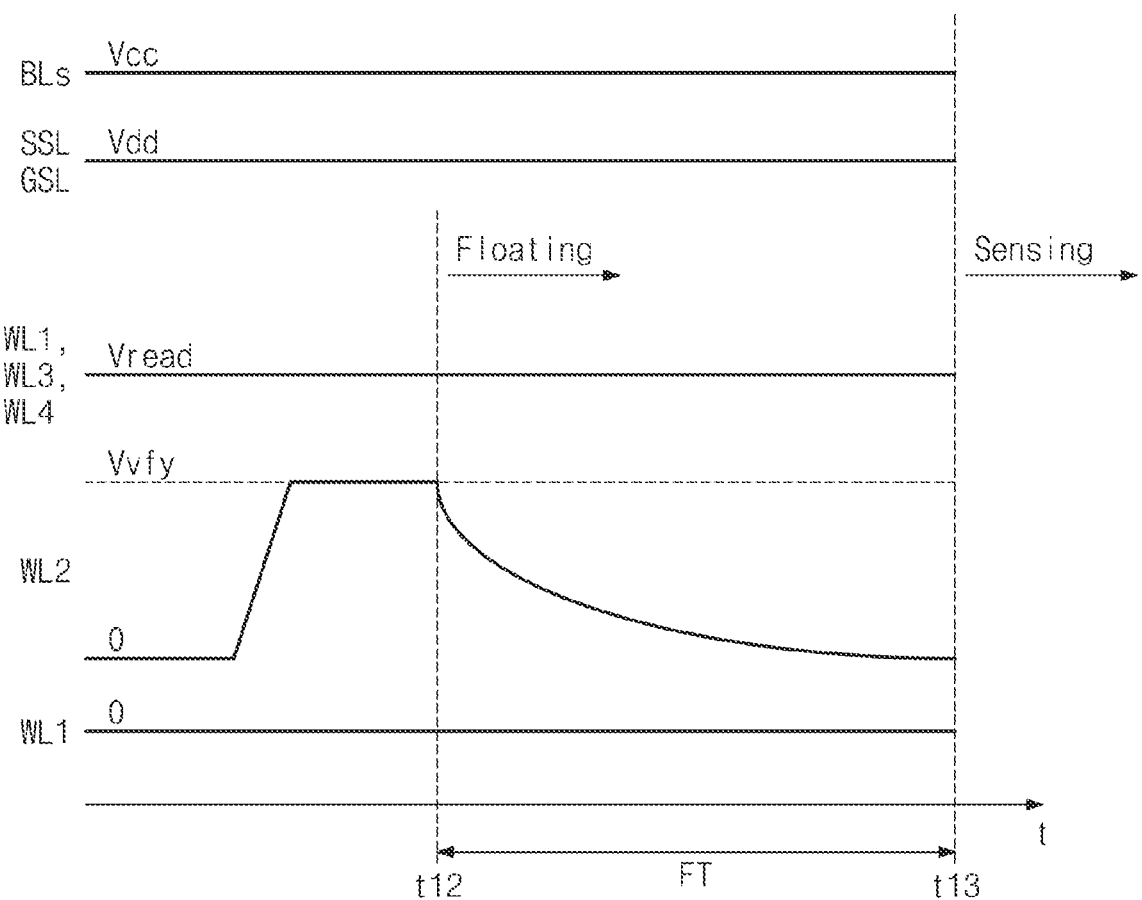

FIGS. 13 and 14 are diagrams for describing another embodiment of a nonvolatile memory device according to the present disclosure.

Referring to FIGS. 2, 13, and 14, a second memory block BLK2 may include the plurality of cell strings CS11 to CS22. A structure of the second memory block BLK2 is similar to the structure of the first memory block BLK1 of FIG. 2, and thus, additional description will be omitted to avoid redundancy. Below, to describe the present disclosure easily, it is assumed that a defect between word lines (marked by "defect WLs" in FIG. 13) occurs at the cell string CS12. The defect between word lines may occur due to a bias difference of vertically adjacent (or upper and lower) word lines in a program operation. As such, as illustrated in FIG. 13, the first word line WL1 and the second word line WL2 of the cell string CS12 may be electrically connected.

The nonvolatile memory device 100 may apply a setting voltage to the plurality of word lines WL1 to WL4 and may float at least one of the plurality of word lines WL1 to WL4. In detail, the nonvolatile memory device 100 may apply a first setting voltage of 0V to the first word line WL1, may apply a second setting voltage Vvfy to the second word line WL2, and may apply a read voltage Vread to the third word line WL3, the fourth word line WL4, first dummy word line DWL1, and second dummy word line DWL2. Power supply voltage Vdd may be applied to string selection lines SSL1a through SSL2 and the ground selection lines GSLs. Afterwards, the nonvolatile memory device 100 may float the second word line WL2. Here, a selection word line targeted for a current program operation may be the second word line WL2, and a selection word line targeted for a next program operation may be the first word line WL1.

Because the first word line WL1 and the second word line WL2 are word lines where the defect between word lines occurs, in the case where the second word line WL2 is floated between times t12 and t13 with the first and second word lines WL1 and WL2 electrically connected, the second setting voltage Vvfy applied to the second word line WL2 may decrease to 0 V applied to the first word line WL1 due to a leakage current LC. That is, because the first setting voltage of 0 V is applied to the first word line WL1, the second setting voltage Vvfy applied to the second word line WL2 may decrease to be close to 0 V.

In the case where the voltage of the second word line WL2 decreases to the voltage of the first word line WL1, memory cells connected with the second word line WL2 may be turned off. The counter 170 may count the number of turned-off memory cells (i.e., off-cells), and the detecting circuit 180 may detect the defect between word lines based on a result of the counting. The nonvolatile memory device 100 may detect a memory block where the defect between word lines occurs and may process the detected memory block as a bad block.

Figure 15:
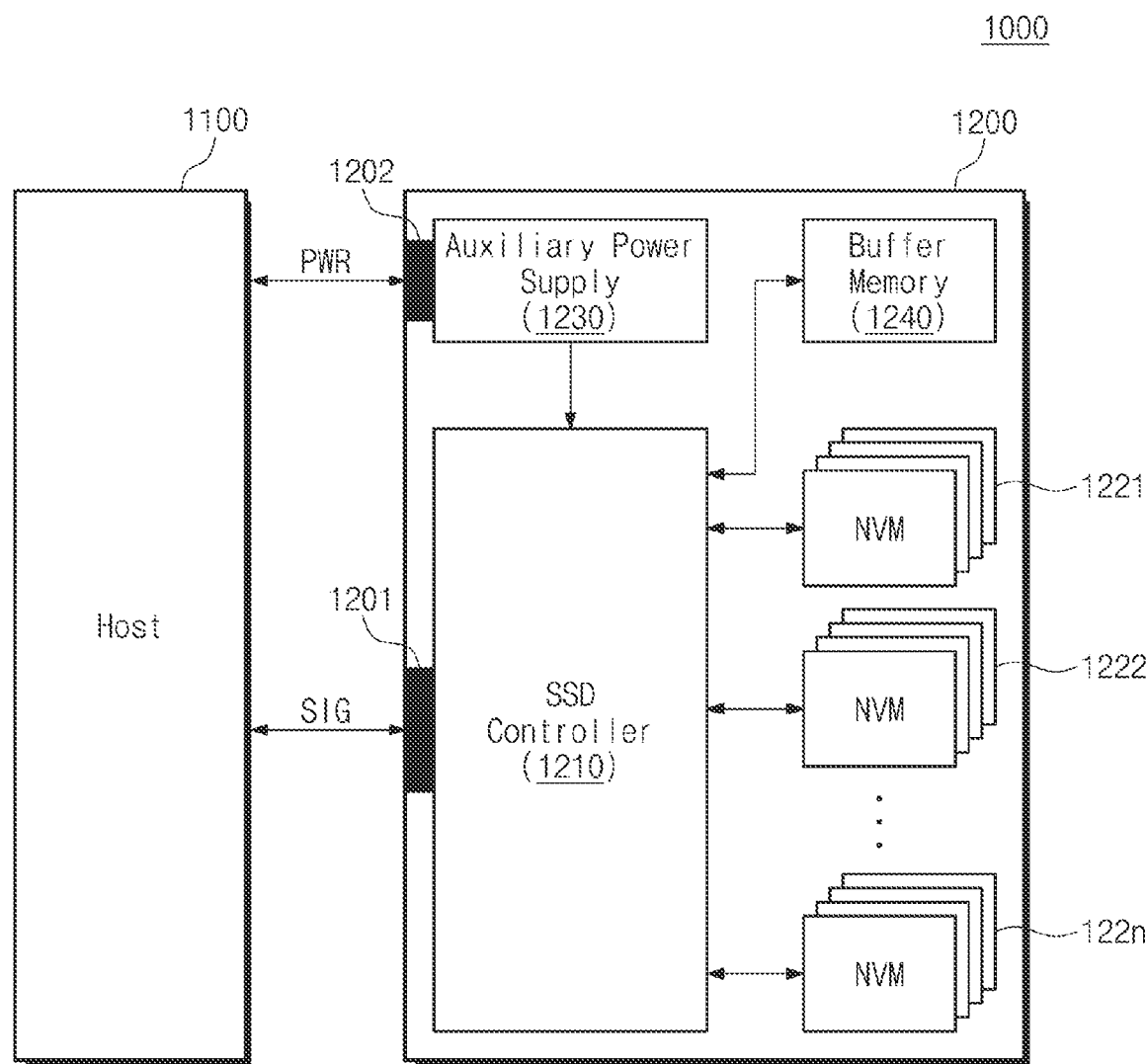
FIG. 15 is a block diagram illustrating a solid state drive (SSD) system including a nonvolatile memory device according to an embodiment of the present disclosure.

FIG. 15 is a block diagram illustrating a solid state drive (SSD) system including a nonvolatile memory device according to an embodiment of the present disclosure.

Referring to FIG. 15, an SSD system 1000 may include a host 1100 and a storage device 1200. For example, the SSD system 1000 may be a computing system, which is configured to process a variety of information, such as a personal computer (PC), a notebook, a laptop, a server, a workstation, a tablet PC, a smartphone, a digital camera, and a black box.

The host 1100 may control overall operations of the SSD system 1000. For example, the host 1100 may store data in the storage device 1200 or may read data stored in the storage device 1200. The storage device 1200 may exchange signals SIG with the host 1100 through a signal connector 1201 and may be supplied with power PWR through a power connector 1202. The storage device 1200 includes an SSD controller 1210, a plurality of nonvolatile memories 1221 to 122n, an auxiliary power supply 1230, and a buffer memory 1240.

The SSD controller 1210 may control the plurality of nonvolatile memories 1221 to 122n in response to the signals SIG received from the host 1100. The plurality of nonvolatile memories 1221 to 122n may operate under control of the SSD controller 1210.

In an embodiment, the SSD controller 1210 may include a reliability manager for securing the reliability of data stored in the plurality of nonvolatile memories 1221 to 122n. For example, the data stored in the plurality of nonvolatile memories 1221 to 122n may include an error due to various factors. An error may be detected and corrected through a separate error correction means (e.g., an ECC engine or various error correction operations). In this case, when the error is uncorrectable by the separate error correction means, the reliability of data stored in the plurality of nonvolatile memories 1221 to 122n may not be guaranteed. That is, data stored in the plurality of nonvolatile memories 1221 to 122n may be lost.

Each of the plurality of nonvolatile memories 1221 to 122n may prevent the reliability of data from being reduced by detecting an error uncorrectable by the error correction means. An example of the error uncorrectable by the error correction means may include the channel hole breakout or the defect between word lines, which is described with reference to FIGS. 1 to 14.

Each of the plurality of nonvolatile memories 1221 to 122n may include the nonvolatile memory device 100 described with reference to FIGS. 1 to 14. Each of the plurality of nonvolatile memories 1221 to 122n may secure the reliability of data by detecting the channel hole breakout or the defect between word lines based on the methods described with reference to FIGS. 1 to 14 and processing a memory block where the channel hole breakout or the defect between word lines is detected, as a bad block.

The auxiliary power supply 1230 is connected with the host 1100 through the power connector 1202. The auxiliary power supply 1230 may be charged by the power PWR supplied from the host 1100. When the power is not smoothly supplied from the host 1100, the auxiliary power supply 1230 may power the SSD system 1200. The buffer memory 1240 may be used as a buffer memory of the storage device 1200.

Figure 16:
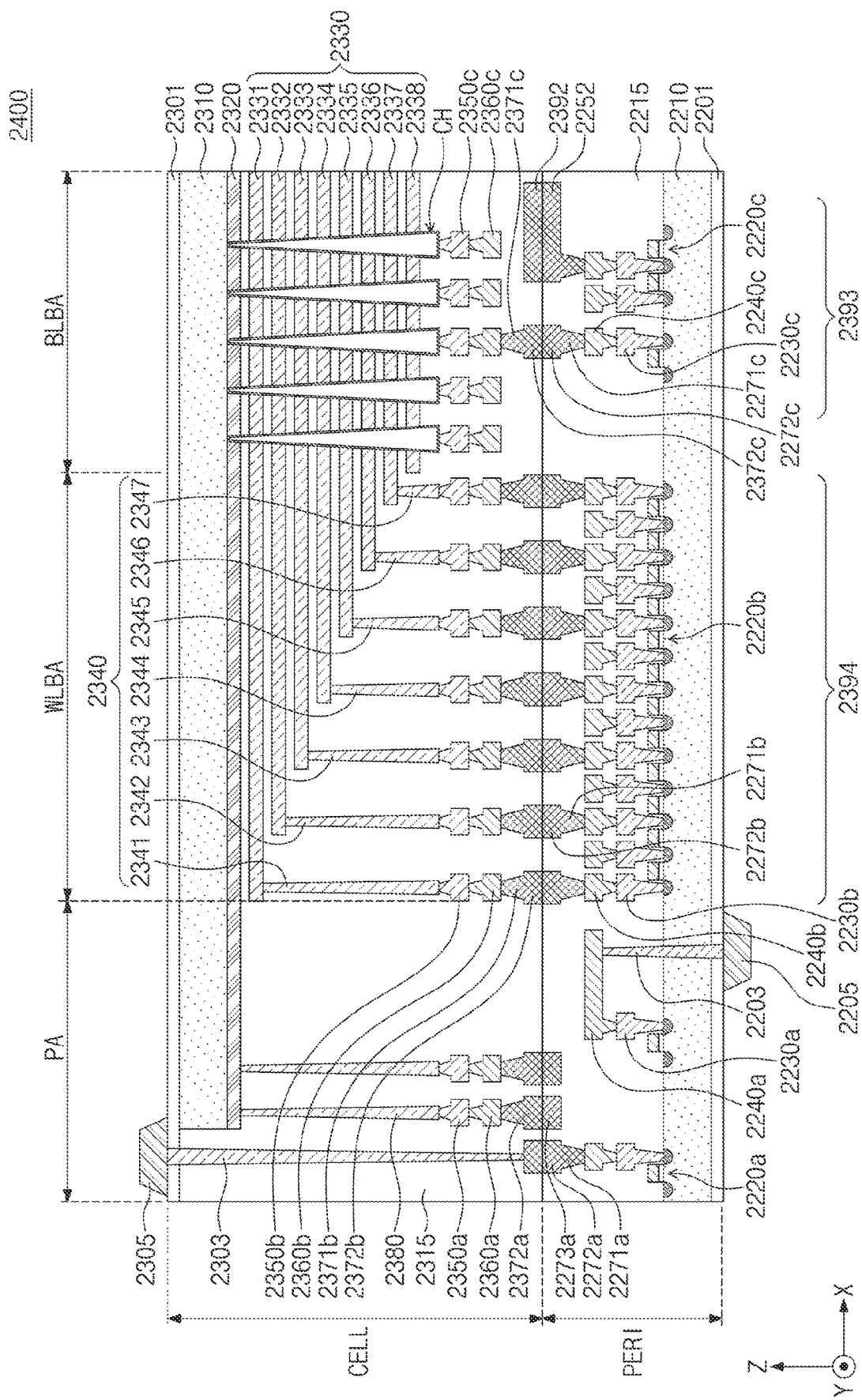
FIG. 16 is a diagram illustrating a memory device according to another embodiment of the present disclosure.

FIG. 16 is a diagram illustrating a memory device according to another embodiment of the present disclosure.

Referring to FIG. 16, a memory device 2400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer different from the first wafer, and then connecting the upper chip and the lower chip in a bonding manner. For example, the bonding manner may include a manner of electrically connecting a bonding metal formed on an uppermost metal layer of the upper chip and a bonding metal formed on an uppermost metal layer of the lower chip. For example, the bonding metal may include copper (Cu) for Cu-to-Cu bonding. However, an embodiment is not limited thereto. For example, the bonding metal may be formed of aluminum (Al) or tungsten (W).

Each of the peripheral circuit region PERI and the cell region CELL of the memory device 2400 may include an external pad bonding area PA, a word line bonding area WLBA, and a bit line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected with the plurality of circuit elements 2220a, 2220b, and 2220c, and second metal layers 2240a, 2240b, and 2240c formed on the first metal layers 2230a, 2230b, and 2230c. In an embodiment, the first metal layers 2230a, 2230b, and 2230c may be formed of tungsten having a relatively high resistance and the second metal layers 2240a, 2240b, and 2240c may be formed of copper having a relatively low resistance.

In the specification, even though the first metal layers 2230a, 2230b, and 2230c and the second metal layers 2240a, 2240b, and 2240c are shown and described, the first metal layers 2230a, 2230b, and 2230c and the second metal layers 2240a, 2240b, and 2240c are not limited thereto, and one or more metal layers may be further formed on the second metal layers 2240a, 2240b, and 2240c. At least a part of the one or more metal layers formed on the second metal layers 2240a, 2240b, and 2240c may be formed of aluminum or the like having a lower resistance than that of copper forming the second metal layers 2240a, 2240b, and 2240c.

The interlayer insulating layer 2215 may be disposed on the first substrate 2210 to cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected with upper bonding metals 2371b and 2372b of the cell region CELL by Cu—Cu bonding. The lower bonding metals 2271b and 2272b and the upper bonding metals 2371b and 2372b may be formed of aluminum, copper, or tungsten.

Also, the upper bonding metals 2371b and 2372b in the cell region CELL may be referred as "first metal pads", and the lower bonding metals 2271b and 2272b in the peripheral circuit region PERI may be referred as "second metal pads".

The cell region CELL may include at least one memory block. The cell region CELL may include a second substrate 2310, an interlayer insulating layer 2315, and a common source line 2320. On the second substrate 2310, a plurality of word lines 2331 to 2338 (i.e., 2330) may be stacked in a direction (i.e., a Z-axis direction) perpendicular to an upper surface of the second substrate 2310. String selection lines and a ground selection line may be arranged on and below the plurality of word lines 2330, respectively, and the plurality of word lines 2330 may be disposed between the string selection lines and the ground selection lines.

Widths of the plurality of word lines 2330 in the X-axis direction may be different. As a distance from the first substrate 2210 of the peripheral circuit region PERI increases, the widths of the plurality of word lines 2330 gradually decrease. Likewise, as a distance from the second substrate 2310 of the cell region CELL increases, the widths of the plurality of word lines 2330 gradually increase.

In the bit line bonding area BLBA, a channel structure CH may extend in a direction perpendicular to the upper surface of the second substrate 2310 and may pass through the plurality of word lines 2330, the string selection lines, and the ground selection line. The channel structure CH may include a data storage layer, a channel layer, a buried insulating layer, and the like, and the channel layer may be electrically connected with a first metal layer 2350c and a second metal layer 2360c. For example, the first metal layer 2350c may be a bit line contact, and the second metal layer 2360c may be a bit line. In an embodiment, the bit line 2360c may extend in a first direction (i.e., a Y-axis direction) parallel to the upper surface of the second substrate 2310.

The interlayer insulating layer 2315 may be disposed on the second substrate 2310 to cover the common source line 2320, the plurality of word lines 2330, a plurality of cell contact plugs 2340, first metal layers 2350a, 2350b, and 2350c, and second metal layers 2360a, 2360b, and 2360c. The interlayer insulating layer 2315 may include an insulating material such as silicon oxide, silicon nitride, or the like.

In an embodiment illustrated in FIG. 16, an area in which the channel structure CH, the bit line 2360c, and the like are disposed may be defined as the bit line bonding area BLBA. In the bit line bonding area BLBA, the bit line 2360c may be electrically connected with the circuit elements 2220c constituting a page buffer 2393 in the peripheral circuit region PERI. The bit line 2360c may be connected with upper bonding metals 2371c and 2372c in the cell region CELL, and upper bonding metals 2371c and 2372c may be connected with lower bonding metals 2271c and 2272c connected with the circuit elements 2220c of the page buffer 2393.

In the word line bonding area WLBA, the plurality of word lines 2330 may extend in a second direction (i.e., an X-axis direction) parallel to the upper surface of the second substrate 2310 and may be connected with a plurality of cell contact plugs 2341 to 2347 (i.e., 2340). The word lines 2330 and the cell contact plugs 2340 may be connected with each other at pads provided by at least some of the plurality of word lines 2330, which extend in the second direction with different lengths. The first metal layer 2350b and the second metal layer 2360b may be sequentially connected with an upper portion of each of the cell contact plugs 2340 connected with the word lines 2330. The cell contact plugs 2340 may be connected with the peripheral circuit region PERI by the upper bonding metals 2371b and 2372b of the cell region CELL and the lower bonding metals 2271b and 2272b of the peripheral circuit region PERI in the word line bonding area WLBA.

The cell contact plugs 2340 may be electrically connected with the circuit elements 2220b constituting a row decoder 2394 in the peripheral circuit region PERI. In an embodiment, operating voltages of the circuit elements 2220b constituting the row decoder 2394 may be different than operating voltages of the circuit elements 2220c constituting the page buffer 2393. For example, operating voltages of the circuit elements 2220c constituting the page buffer 2393 may be greater than operating voltages of the circuit elements 2220b constituting the row decoder 2394.

A common source line contact plug 2380 may be disposed in the external pad bonding area PA. The common source line contact plug 2380 may be formed of a conductive material such as a metal, a metal compound, polysilicon, or the like and may be electrically connected with the common source line 2320. The first metal layer 2350a and the second metal layer 2360a may be sequentially stacked on an upper portion of the common source line contact plug 2380. For example, an area in which the common source line contact plug 2380, the first metal layer 2350a, and the second metal layer 2360a are disposed may be defined as the external pad bonding area PA.

Meanwhile, input/output pads 2205 and 2305 may be disposed in the external pad bonding area PA. Referring to FIG. 16, a lower insulating film 2201 covering a lower surface of the first substrate 2210 may be formed below the first substrate 2210, and the first input/output pad 2205 may be formed on the lower insulating film 2201. The first input/output pad 2205 may be connected with at least one of the plurality of circuit elements 2220a, 2220b, and 2220c disposed in the peripheral circuit region PERI through a first input/output contact plug 2203 and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

Referring to FIG. 16, an upper insulating film 2301 covering the upper surface of the second substrate 2310 may be formed on the second substrate 2310, and the second input/output pad 2305 may be disposed on the upper insulating film 2301. The second input/output pad 2305 may be connected with at least one of the plurality of circuit elements 2220a, 2220b, and 2220c disposed in the peripheral circuit region PERI through a second input/output contact plug 2303 and lower bonding metals 2271a and 2271b of the peripheral circuit region PERI. In an embodiment, the second input/output pad 2305 may be electrically connected with the circuit element 2220a.

According to embodiments, the second substrate 2310 and the common source line 2320 may not be disposed in an area in which the second input/output contact plug 2303 is disposed. Also, the second input/output pad 2305 may not overlap the word lines 2330 in the third direction (i.e., the Z-axis direction). Referring to FIG. 16, the second input/output contact plug 2303 may be separated from the second substrate 2310 in a direction parallel to the upper surface of the second substrate 2310, may pass through the interlayer insulating layer 2315 of the cell region CELL, and may be connected with the second input/output pad 2305.

According to embodiments, the first input/output pad 2205 and the second input/output pad 2305 may be selectively formed. For example, the nonvolatile memory device 2400 may include only the first input/output pad 2205 disposed on the first substrate 2210 or the second input/output pad 2305 disposed on the second substrate 2310. Alternatively, the nonvolatile memory device 2400 may include both the first input/output pad 2205 and the second input/output pad 2305.

In each of the external pad bonding area PA and the bit line bonding area BLBA respectively included in the cell region CELL and the peripheral circuit region PERI, a metal pattern in the uppermost metal layer may be provided as a dummy pattern, or the uppermost metal layer may be absent.

In the external pad bonding area PA, the memory device 2400 may include a lower metal pattern 2273a in the uppermost metal layer of the peripheral circuit region PERI, and the lower metal pattern 2273a may correspond to an upper metal pattern 2372a formed in the uppermost metal layer of the cell region CELL and may have the same shape as the upper metal pattern 2372a of the cell region CELL. In the peripheral circuit region PERI, the lower metal pattern 2273a formed in the uppermost metal layer of the peripheral circuit region PERI may not be connected with a contact. As in the above description, in the external pad bonding area PA, the upper metal pattern 2372a that corresponds to the lower metal pattern 2273a formed in the uppermost metal layer of the peripheral circuit region PERI and has the same shape as the lower metal pattern 2273a of the peripheral circuit region PERI may be formed in the uppermost metal layer of the cell region CELL.

The lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected with the upper bonding metals 2371b and 2372b of the cell region CELL by Cu—Cu bonding.

Also, in the bit line bonding area BLBA, an upper metal pattern 2392 that corresponds to a lower metal pattern 2252 formed in the uppermost metal layer of the peripheral circuit region PERI and has the same shape as the lower metal pattern 2252 of the peripheral circuit region PERI may be formed in the uppermost metal layer of the cell region CELL. A contact may not be formed on the upper metal pattern 2392 formed in the uppermost metal layer of the cell region CELL.

In an embodiment, a reinforce metal pattern that corresponds to a metal pattern formed in an uppermost metal layer of one of the cell region CELL and the peripheral circuit region PERI and has the same shape as the metal pattern may be formed in an uppermost metal layer of the other of the cell region CELL and the peripheral circuit region PERI. A contact pattern may not be formed on the reinforce metal pattern.

In an embodiment, a memory cell array or a memory block described with reference to FIGS. 1 to 15 may be included in the cell region CELL of FIG. 16. Peripheral circuits (e.g., a row decoder, a page buffer circuit, an input/output circuit, and a control logic circuit) described with reference to FIGS. 1 to 15 may be included in the peripheral circuit region PERI. In an embodiment, a counter (i.e., 170 in FIG. 1) configured to count the number of off-cells and a detecting circuit (i.e., 180 in FIG. 1) configured to detect a defect cell may be included in the peripheral circuit region PERI.

As described above, the counter and the detecting circuit may be included in the peripheral circuit region PERI, the counter may perform a counting operation described with reference to FIGS. 1 to 15 based on a signal from the cell region CELL, and the detecting circuit may detect a defect cell or a defect between word lines based on a result of the counting operation. A result of detecting a defect cell or a defect between word lines may be provided to an external memory controller through external input/output pads.

According to embodiments of the present disclosure, a nonvolatile memory device may in advance detect a defect cell based on the number of off-cells counted with a selection word line floated in an erase/program operation. Also, as a block where a defect cell is detected is processed as a bad block, a nonvolatile memory device with improved reliability and improved performance and an operation method thereof are provided.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A nonvolatile memory device comprising:
a memory cell array including a plurality of cell strings, wherein each of the plurality of cell strings includes memory cells stacked on a substrate in a direction perpendicular to the substrate;
a row decoder connected with the memory cells through a plurality of word lines and configured to apply a setting voltage to at least one word line of the plurality of word lines and to float the at least one word line during a floating time;
a page buffer circuit connected with the plurality of cell strings through a plurality of bit lines and configured to sense voltage changes of the plurality of bit lines after the at least one word line is floated during the floating time and to output a page buffer signal as a sensing result;
a counter configured to count a number of off-cells in response to the page buffer signal; and
a detecting circuit configured to output a detection signal associated with a defect cell based on the number of off-cells.

2. The nonvolatile memory device of claim 1, wherein:
the setting voltage is greater than threshold voltages of memory cells connected with at least one word line from among the memory cells, and
the floating time is proportional to a magnitude of the setting voltage.

3. The nonvolatile memory device of claim 1, wherein a gate of the defect cell and a channel of at least one cell string including the defect cell from among the plurality of cell strings are electrically connected.

4. The nonvolatile memory device of claim 3, wherein a voltage of a word line connected with the defect cell decreases as the floating time passes.

5. The nonvolatile memory device of claim 1, wherein the page buffer circuit outputs the page buffer signal in response to determining that a voltage of at least one bit line of the plurality of bit lines decreases.

6. The nonvolatile memory device of claim 1, wherein the detecting circuit is configured to:
output the detection signal indicating that the at least one word line is connected with the defect cell, when the number of off-cells is more than a first reference value; and
output the detection signal indicating that the at least one word line is not connected with the defect cell, when the number of off-cells is equal to or less than the first reference value.

7. The nonvolatile memory device of claim 1, wherein:
the memory cell array performs an erase operation in response to an erase command,
the row decoder applies a first setting voltage to the at least one word line before the erase operation is performed or applies a second setting voltage to the at least one word line after the erase operation is performed, and
the first setting voltage is different from the second setting voltage.

8. The nonvolatile memory device of claim 1, wherein:
the memory cell array performs a program operation including a plurality of program loops in response to a program command,
in the program operation, the row decoder applies a program verification voltage to the at least one word line, and
based on the program verification voltage, the counter counts a first number of off-cells after execution of a first program loop and counts a second number of off-cells after execution of a second program loop.

9. The nonvolatile memory device of claim 8, wherein when a difference between the first number of off-cells and the second number of off-cells is smaller than a second reference value, the row decoder is configured to apply the setting voltage to the at least one word line and to float the at least one word line during the floating time.

10. The nonvolatile memory device of claim 9, wherein the setting voltage and the floating time increase as a program loop is repeated.

11. A storage device comprising:
a nonvolatile memory device including a plurality of cell strings, wherein each of the plurality of cell strings includes memory cells stacked on a substrate in a direction perpendicular to the substrate; and
a memory controller configured to transmit a command to the nonvolatile memory device, wherein:
the nonvolatile memory device performs a defect cell detection operation in response to the command, and
the defect cell detection operation includes:
applying a setting voltage to at least one word line of a plurality of word lines connected with the memory cells;
floating the at least one word line during a floating time;
after the at least one word line is floated during the floating time, sensing voltage changes of a plurality of bit lines connected with the plurality of cell strings and outputting a page buffer signal as a sensing result;
counting a number of off-cells in response to the page buffer signal; and
outputting a detection signal associated with a defect cell based on the number of off-cells.

12. The storage device of claim 11, wherein:
the setting voltage is greater than threshold voltages of memory cells connected with at least one word line from among the memory cells, and
the floating time is proportional to a magnitude of the setting voltage.

13. The storage device of claim 11, wherein the nonvolatile memory device generates the page buffer signal in response to determining that a voltage of at least one bit line of the plurality of bit lines decreases.

14. The storage device of claim 11, wherein the nonvolatile memory device is configured to:
output the detection signal, to the memory controller, indicating that the at least one word line is connected with the defect cell, when the number of off-cells is more than a first reference value; and
output the detection signal, to the memory controller, indicating that the at least one word line is not connected with the defect cell, when the number of off-cells is equal to or less than the first reference value.

15. The storage device of claim 11, wherein:
the nonvolatile memory device performs an erase operation in response to an erase command from the memory controller, and
the defect cell detection operation further includes:
applying the setting voltage which is variable depending on an order of performing the defect cell detection operation and the erase operation; and
floating the at least one word line during the floating time which is variable depending on the order of performing the defect cell detection operation and the erase operation.

16. The storage device of claim 11, wherein:
the nonvolatile memory device performs a program operation including a plurality of program loops in response to a program command from the memory controller, and
the defect cell detection operation is performed when a difference between a first number of off-cells after execution of a first program loop and a second number of off-cells after execution of a second program loop is smaller than a second reference value.

17. The storage device of claim 16, wherein the setting voltage and the floating time increase as a program loop is repeated.

18. An operation method of a nonvolatile memory device which includes a plurality of cell strings, each of which includes memory cells stacked on a substrate in a direction perpendicular to the substrate, the method comprising:
applying a setting voltage to at least one word line of a plurality of word lines connected with the memory cells;
floating the at least one word line during a floating time;
after the at least one word line is floated during the floating time, sensing voltage changes of a plurality of bit lines connected with the plurality of cell strings and outputting a page buffer signal as a sensing result;
counting a number of off-cells in response to the page buffer signal; and
outputting a detection signal associated with a defect cell based on the number of off-cells.

19. The method of claim 18, wherein:
the setting voltage is greater than threshold voltages of memory cells connected with at least one word line from among the memory cells, and
the floating time is proportional to a magnitude of the setting voltage.

20. The method of claim 18, wherein the outputting of the detection signal associated with the defect cell includes:
- outputting the detection signal indicating that the at least one word line is connected with the defect cell, when the number of off-cells is more than a first reference value; and
- outputting the detection signal indicating that the at least one word line is not connected with the defect cell, when the number of off-cells is equal to or less than the first reference value.

21. A method of operating a nonvolatile memory device comprising memory cells that are each addressed by the same word line and a different bit line among bit lines, the method comprising:
- a) applying a setting voltage to the word line and thereafter floating the word line; and
- b) after floating the word line for a predetermined period, sensing the bit lines to determine a number of the memory cells whose voltages are less than a predetermined reference voltage.

22. The method of claim 21, wherein the setting voltage is greater than the reference voltage.

23. The method of claim 21, further comprising precluding the memory cells from being programmed in response to determining the number exceeds a predetermined reference number.

24. The method of claim 21, further comprising precluding the memory cells from being programmed during a subsequent iteration of an incremental step pulse programming operation in response to determining the number exceeds a predetermined reference number.

25. The method of claim 21, further comprising:
- repeating operations (a) and (b) for each of multiple states to which the memory cells may be programmed, wherein:
- a value of the setting voltage for each repetition of operations (a) and (b) exceeds a verification voltage for determining a successful programming of a memory cell, among the memory cells, to a corresponding one of the multiple states, and
- the value of the setting voltage differs for each repetition of operations (a) and (b).

\* \* \* \* \*